(12) United States Patent
Tanaka et al.

(10) Patent No.: US 9,197,230 B2
(45) Date of Patent: Nov. 24, 2015

(54) ATOMIC OSCILLATOR, ELECTRONIC APPARATUS, AND MOVING OBJECT

(71) Applicant: Seiko Epson Corporation, Tokyo (JP)

(72) Inventors: Noriaki Tanaka, Chino (JP); Koji Chindo, Suwa (JP); Hiroyuki Yoshida, Suwa (JP); Yoshiyuki Maki, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/496,472

(22) Filed: Sep. 25, 2014

(65) Prior Publication Data

US 2015/0091660 A1 Apr. 2, 2015

(30) Foreign Application Priority Data

Sep. 27, 2013 (JP) ................. 2013-202239

(51) Int. Cl.
*H03L 7/26* (2006.01)
*G04F 5/14* (2006.01)
*H03L 5/00* (2006.01)
*H03L 1/00* (2006.01)

(52) U.S. Cl.
CPC *H03L 7/26* (2013.01); *G04F 5/145* (2013.01); *H03L 1/00* (2013.01); *H03L 5/00* (2013.01)

(58) Field of Classification Search
CPC ............... H03L 7/26; H03L 5/00; G04F 5/14; G04F 5/145
USPC ..................................... 331/94.1, 3
See application file for complete search history.

(56) References Cited

U.S. PATENT DOCUMENTS

| 6,320,472 | B1 | 11/2001 | Vanier |
| 8,253,503 | B2 * | 8/2012 | Aoyama et al. ............... 331/94.1 |
| 2011/0187467 | A1 | 8/2011 | Chindo |

FOREIGN PATENT DOCUMENTS

| JP | 07-050580 | 2/1995 |
| JP | 2000-261092 A | 9/2000 |
| JP | 2001-156387 A | 6/2001 |
| JP | 2001-285064 A | 10/2001 |
| JP | 2008-153537 A | 7/2008 |
| JP | 2011-091476 A | 5/2011 |
| JP | 2011-091961 A | 5/2011 |
| JP | 2011-100961 A | 5/2011 |
| JP | 2011-101211 A | 5/2011 |
| JP | 2013-098607 A | 5/2013 |
| JP | 2013-239776 A | 11/2013 |
| JP | 2014-007760 A | 1/2014 |

* cited by examiner

*Primary Examiner* — Ryan Johnson
(74) *Attorney, Agent, or Firm* — Harness, Dickey & Pierce, P.L.C.

(57) ABSTRACT

An atomic oscillator includes a gas cell, a semiconductor laser, a light detector, a bias control section controlling a bias current based on intensity of light detected by the light detector, a memory, and an MPU. The MPU sweeps the bias current and stores a value of the bias current and a value of the intensity of the light when the intensity of the detected light shifts from a decrease to an increase and re-sweeps to set the bias current based on the value of the bias current stored in the memory after the sweep, compares the value of the intensity of the detected light with the value of the intensity of the light stored in the memory while the bias current control section controls the bias current, and determines whether to perform the sweep again in accordance with the comparison.

11 Claims, 12 Drawing Sheets

ATOMIC OSCILLATOR, ELECTRONIC APPARATUS, AND MOVING OBJECT

BACKGROUND

1. Technical Field

The present invention relates to an atomic oscillator, an electronic apparatus, and a moving object.

2. Related Art

As shown in FIG. 13, a cesium atom, which is a kind of alkali metal atom, has a ground level of $6S_{1/2}$ and two excitation levels of $6P_{1/2}$ and $6P_{3/2}$, and furthermore, the respective levels of $6S_{1/2}$, $6P_{1/2}$, and $6P_{3/2}$ have ultrafine structures with a plurality of split energy levels. Specifically, $6S_{1/2}$ has two ground levels F=3 and 4, $6P_{1/2}$ has two excitation levels F'=3 and 4, and $6P_{3/2}$ has four excitation levels F'=2, 3, 4, and 5.

For example, a cesium atom in a ground level F of $6S_{1/2}$=3 can shift to one of the excitation levels F' of $6P_{3/2}$=2, 3, and 4, by absorbing a D2 beam while the cesium atom cannot shift to the excitation level F'=5. A cesium atom in the ground level F of $6S_{1/2}$=4 can shift to one of the excitation levels F' of $6P_{3/2}$=3, 4, and 5 by absorbing the D2 beam while the cesium atom cannot shift to the excitation level F'=2. This is based on a transition selection rule on an assumption of electric dipole transition. In contrast, a cesium atom in one of excitation levels F' of $6P_{3/2}$=3 and 4 emits the D2 beam and can shift to a ground level F of $6S_{1/2}$=3 or 4 (either an original ground level or the other ground level). Here, the three levels (the two ground levels and one excitation level) consisting of the two ground levels F of $6S_{1/2}$=3 and 4 and one of the excitation levels F' of $6P_{3/2}$=3 and are referred to as Λ-type three levels since Λ-type transition by absorption and light emission of the D2 beam is possible. Similarly, the three levels consisting of two ground levels F of $6S_{1/2}$=3 and 4 and one of the excitation levels F' of $6P_{1/2}$=3 and 4 can realize the Λ-type transition by absorption and light emission of a D1 beam and therefore forms the Λ-type three levels.

On the other hand, a cesium atom in an excitation level F' of $6P_{3/2}$=2 emits the D2 beam and always shifts to a ground level of $6S_{1/2}$=3 (original ground level), and similarly, a cesium atom in an excitation level F' of $6P_{3/2}$=5 emits the D2 beam and always shifts to a ground level F of $6S_{1/2}$=4 (original ground level). That is, the three levels consisting of the two ground levels F of $6S_{1/2}$=3 and 4 and the excitation level F' of $6P_{3/2}$=2 or 5 cannot realize the Λ-type transition by absorption and emission of the D2 beam and therefore do not form the Λ-type three levels. In addition, it has been known that alkali metal atoms other than the cesium atom similarly have two ground levels and an excitation level which form the Λ-type three levels.

Incidentally, if an alkali metal atom in the form of a gas is irradiated simultaneously with resonance light (referred to as resonance light 1) with a frequency (the number of vibrations) corresponding to an energy difference between the first ground level (the ground level F of $6S_{1/2}$=3 in the case of a cesium atom) which forms the Λ-type three levels and the excitation level (the excitation level F' of $6P_{3/2}$=4, for example, in the case of the cesium atom) and with resonance light (referred to as resonance light 2) with a frequency (the number of vibrations) corresponding to an energy difference between the second ground level (the ground level F of $6S_{1/2}$=4 in the case of the cesium atom) and the excitation level, it is known that a state where the two ground levels are overlapped, namely a quantum coherence state (dark state) is created and that an electromagnetically induced transparency (EIT) phenomenon (also referred to as a coherent population trapping (CPT)) in which excitation to the excitation level is stopped occurs. A frequency difference between a resonance light pair (the resonance light 1 and the resonance light 2) which causes the EIT phenomenon completely coincides with a frequency corresponding to an energy difference $\Delta E_{12}$ between the two ground levels of the alkali metal atom. In the case of the cesium atom, for example, a frequency corresponding to the energy difference between the two ground levels is 9.192631770 GHz, and therefore, the EIT phenomenon occurs if the cesium atom is irradiated simultaneously with two types of laser light, namely the D1 light and the D2 light with a frequency difference of 9.192631770 GHz.

Accordingly, intensity of light which penetrates through the alkali metal atom steeply changes depending on whether or not light with a frequency $\omega_1$ and light with a frequency $\omega_2$ function as the resonance light pair and the alkali metal atom causes the EIT phenomenon when the alkali metal atom in the form of a gas is irradiated simultaneously with the two light waves as shown in FIG. 14. A signal indicating intensity of transmitted light, which steeply changes, is referred to as an EIT signal (resonance signal), and a level of the EIT signal indicates a peak value when the frequency difference $\omega_1$-$\omega_2$ between the resonance light pair completely coincides with the frequency $\omega_{12}$ corresponding to $\Delta E_{12}$. Thus, it is possible to realize an oscillator with high accuracy by controlling a light detector so as to detect a peak top of the EIT signal, such that the frequency difference $\omega_1$-$\omega_2$ of the two light waves completely coincides with the frequency $\omega_{12}$ corresponding to $\Delta E_{12}$ by irradiating an atom cell (gas cell) in which the alkali metal atom in the form of gas is encapsulated with the two light waves. Such a technology relating to the atomic oscillator is disclosed in U.S. Pat. No. 6,320,472, for example.

According to an atomic oscillator of the EIT scheme, a semiconductor laser generates light, a center frequency $f_0$ of which is modulated with a modulation frequency $f_m$, by superimposing a modulation signal with the frequency $f_m$ on the bias current determining the center frequency $f_0$ (=$v/\lambda_0$: v represents a velocity of light, $\lambda_0$ represents a center wavelength) (carrier frequency) of the light generated by the semiconductor laser and supplying the superimposed modulation signal to the semiconductor laser, for example. The gas cell is irradiated with the light emitted by the semiconductor laser, and light which penetrates through the gas cell is detected by a light detector. An oscillation frequency of a voltage controlled crystal oscillator (VCXO) is controlled in accordance with intensity of the light detected by the light detector, and a modulation signal with a frequency $f_m$ is generated via a Phase Locked Loop (PLL) circuit. Then, control is performed such that first-order sideband light which is emitted by the semiconductor laser, namely light with a frequency $f_0+f_m$ and light with a frequency $f_0-f_m$ forms a resonance light pair. By such control, a frequency deviation of an output signal of the voltage controlled crystal oscillator (VCXO) is significantly reduced, and it is possible to realize an oscillator with high frequency accuracy.

Since frequency accuracy (short-term stability) is further enhanced as S/N of an EIT signal increases, it is desirable that the center wavelength $\lambda_0$ of the light emitted by the semiconductor laser be adjusted to an optimal wavelength so as to maximize an amount of light absorption of the gas cell. Thus, JP-A-2011-101211 proposes an atomic oscillator capable of pushing a direct current bias current to a point at which the intensity of the transmitted light that penetrates through the cell encapsulating the alkali metal atom is minimized, for example.

However, if a long time (ten years, for example) has passed, there is a case where a bias current value when the amount of light absorption of the gas cell reaches the maximum value (the minimum point of an absorption band) significantly deviates from an initial setting value due to time degradation of the semiconductor laser. In addition, since the absorption band has two absorption bottoms in practice, there is a possibility in that the direct current bias current is pushed to a bottom with a smaller absorption amount depending on a size and a direction of the deviation of the bias current value from the initial setting value in the case of the atomic oscillator in the related art as disclosed in JP-A-2011-101211.

SUMMARY

An advantage of some aspects of the invention is to provide an atomic oscillator capable of being stable in a vicinity of a minimum point of an absorption band, and an electronic apparatus and a moving object, in each of which the atomic oscillator is used.

An aspect of the invention can be implemented as the following forms or application examples.

Application Example 1

This application example is directed to an atomic oscillator including: a cell which encapsulates metal atoms therein; a light source which generates light for irradiation of the cell; a light detecting section which detects light penetrating through the cell; a bias current control section which controls a bias current to be supplied to the light source based on intensity of light detected by the light detecting section; a storage section; and a bias current setting section which performs sweep processing of sweeping the bias current and storing on the storage section a value of the bias current and a value of the intensity of the light when the intensity of the light detected by the light detecting section shifts from a decrease to an increase and re-sweep determination processing of setting the bias current based on the value of the bias current stored on the storage section after the sweep processing, comparing the value of the intensity of the light detected by the light detecting section with the value of the intensity of the light stored on the storage section in a state where the bias current control section controls the bias current, and determining whether or not to perform the sweep processing again in accordance with a comparison result.

For example, the bias current setting section may perform the sweep processing when a power source is activated.

According to the atomic oscillator of the application example, a bias current can be automatically set and be stabilized in a vicinity of a minimum point of an absorption band by storing a value of the bias current and a value of the light intensity in the vicinity of the minimum point of the light absorption band of the gas cell in the sweep processing and setting the bias current to a value stored in the sweep processing, comparing the value of the intensity of the light in the state where the bias current is stabilized (locked) with the value stored in the sweep processing in the re-sweep determination processing, and retrying the sweep processing as necessary. Accordingly, it is possible to enhance frequency stability by the atomic oscillator in this application example.

In this case, the atomic oscillator in this application example may include a frequency control section which controls the light source to generate light including a resonance light pair for causing an electromagnetically induced transparency phenomenon in the metal atoms based on the intensity of the light detected by the light detecting section.

Application Example 2

In the atomic oscillator according to the application example described above, the bias current setting section may determine to perform the sweep processing again when a difference or a ratio between the value of the intensity of the light detected by the light detecting section and the value of the intensity of the light stored on the storage section is greater than a threshold value stored on the storage section in the re-sweep determination processing.

According to the atomic oscillator of this application example, it is possible to achieve the stabilization in the vicinity of the minimum point of the absorption band by retrying the sweep processing in consideration of a possibility in that the stabilization was achieved at a minimum point, which is different from the minimum point of the absorption band, when the value of the light intensity in a state where the bias current is stabilized (locked) is different from the value, which is stored in the sweep processing, in the re-sweep determination processing.

Application Example 3

In the atomic oscillator according to the application example described above, the bias current setting section may compare the value of the bias current and a value of the bias current stored on the storage section in a state where the bias current control section controls the bias current and determine whether or not to perform the sweep processing again in accordance with a comparison result in the re-sweep determination processing.

According to the atomic oscillator of this application example, it is possible to achieve the stabilization in the vicinity of the minimum point of the absorption band by comparing the value of the bias current in the stabilized (locked) state with the value, which is stored in the sweep processing, in the re-sweep determination processing and retrying the sweep-processing as necessary.

Application Example 4

In the atomic oscillator according to the application example described above, the bias current setting section may determine to perform the sweep processing again when a difference or a ratio between the value of the bias current and a value of the bias current stored on the storage section is greater than a threshold value which is stored on the storage section in the re-sweep determination processing.

According to the atomic oscillator of this application example, it is possible to achieve the stabilization in the vicinity of the minimum point of the absorption band by retrying the sweep-processing in consideration of a possibility in that the stabilization was made at a minimum point, which is different from the minimum point of the absorption band, when the value of the bias current in the stabilized (locked) state is different from the value, which is stored in the sweep processing, in the re-sweep determination processing.

Application Example 5

In the atomic oscillator of the above application example described above, the bias current setting section may perform the re-sweep determination processing every time the sweep processing is performed.

According to the atomic oscillator of this application example, since the re-sweep determination processing is always performed after the sweep processing and bias current automatic setting is not completed in re-determination processing until it is determined in the re-determination processing that the sweep processing is not to be performed, it is possible to reliably achieve the stabilization in the vicinity of the minimum point of the absorption band.

Application Example 6

In the atomic oscillator according to the application example described above, the bias current setting section may perform adjustment determination processing of setting the bias current based on the value of the bias current stored on the storage section, comparing the value of the intensity of the light detected by the light detecting section with the value of the intensity of the light stored on the storage section in a state where the bias current control section controls the bias current, and determining whether or not to perform the sweep processing in accordance with a comparison result, prior to the sweep processing.

For example, the storage section may be a non-volatile storage section, and the bias current setting section may perform the adjustment determination processing when the power source is activated.

According to the atomic oscillator of this application example, it is possible to omit unnecessary sweep processing and to reduce bias current setting time and power consumption by setting the bias current to the stored value, comparing the value of the intensity of the light in the state where the bias current is stabilized (locked) with the stored value in the adjustment determination processing prior to the sweep processing, performing the sweep processing when necessary, and not performing the sweep processing when not necessary.

Application Example 7

In the atomic oscillator according to the application example described above, the bias current setting section may determine to perform the sweep processing when a difference or a ratio between the value of the intensity of the light detected by the light detecting section and the value of the intensity of the light stored on the storage section is greater than the threshold value stored on the storage section in the adjustment determination processing.

According to the atomic oscillator of the application example, it is possible to acquire the bias current value for the stabilization in the vicinity of the minimum point of the absorption band by performing the sweep processing in consideration of the possibility that the stability was made at a minimum point, which is different from the minimum point of the absorption band, when the value of the light intensity is different from the stored value in the adjustment determination processing.

Application Example 8

In the atomic oscillator according to the application example described above, the bias current setting section may compare the value of the bias current with the value of the bias current stored on the storage section in the state where the bias current control section controls the bias current and determine whether or not to perform the sweep processing in accordance with a comparison result in the adjustment determination processing.

According to the atomic oscillator of this application example, it is possible to omit unnecessary sweep processing and to reduce bias current setting time and power consumption by comparing the value of the bias current in the stabilized (locked) state with the stored value in the adjustment determination processing, performing the sweep processing when necessary, and not performing the sweep processing when not necessary.

Application Example 9

In the atomic oscillator according to the application example described above, the bias current setting section may determine to perform the sweep processing when a difference or a ratio between the value of the bias current and the value of the bias current stored on the storage section is greater than the threshold value stored on the storage section in the adjustment determination processing.

According to the atomic oscillator of this application example, it is possible to acquire the bias current value for the stabilization in the vicinity of the minimum point of the absorption band by performing the sweep processing in consideration of the possibility that the stabilization was made at a minimum point, which is not the minimum point of the absorption band, when the value of the bias current in the stabilized (locked) state is different from the stored value in the adjustment determination processing.

Application Example 10

This application example is directed to an electronic apparatus including any one of the above atomic oscillators.

Application Example 11

This application example is directed to a moving object including any one of the above atomic oscillators.

According to these application examples, it is possible to provide the electronic apparatus and the moving object with high reliability since the atomic oscillator with high frequency stability is provided therein.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a detailed description will be given of preferred embodiments of the invention with reference to the drawings. In addition, the embodiments described below are not intended to unreasonably limit content of the invention described in the appended claims. In addition, all the constituents described below are not necessarily essential constituent requirements of the invention.

1. Atomic Oscillator

1-1. First Embodiment

Configuration of Atomic Oscillator

Figure 1:
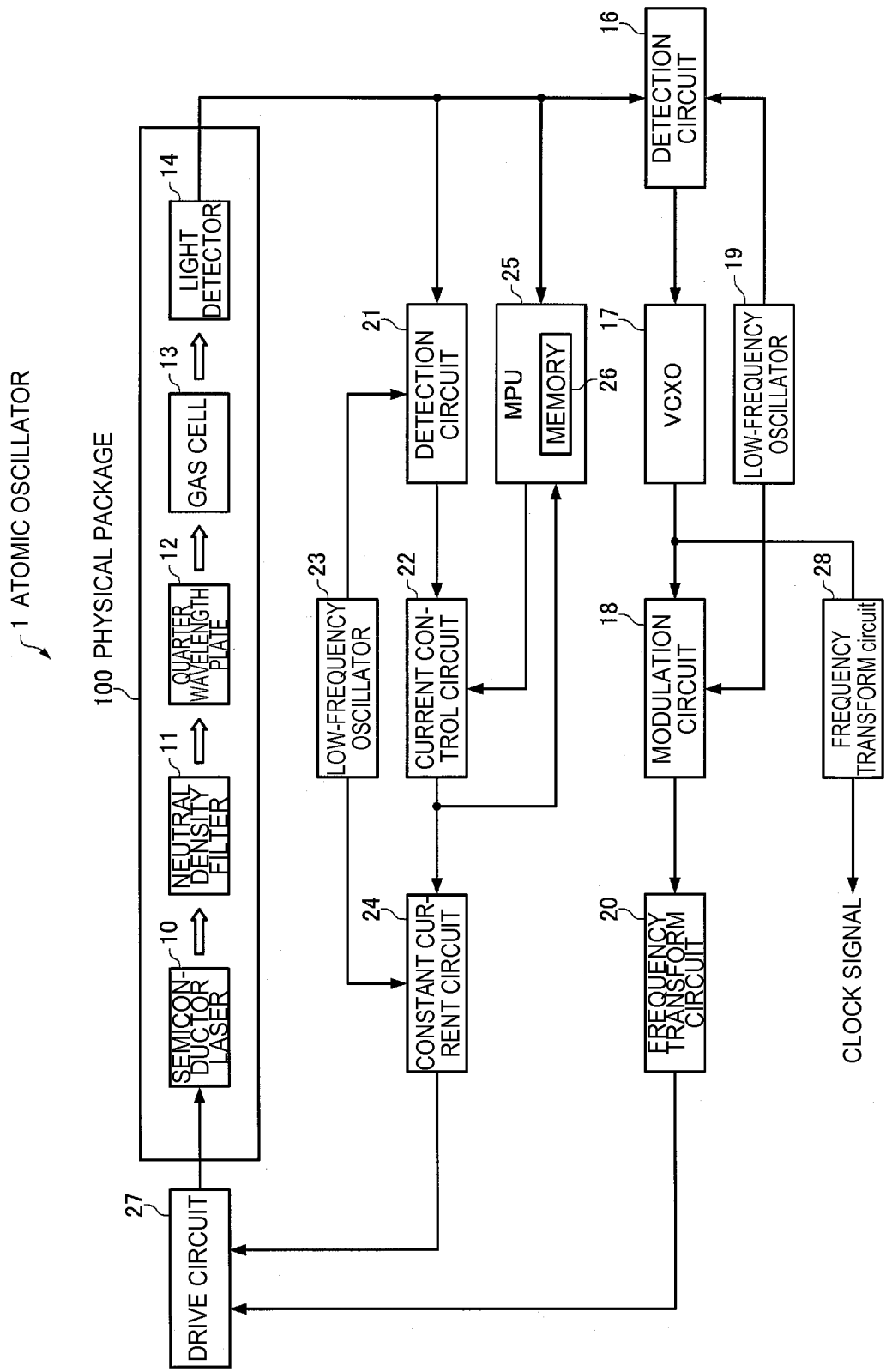
FIG. 1 is a diagram showing a configuration example of an atomic oscillator according to an embodiment.

FIG. 1 is a diagram showing a configuration example of an atomic oscillator according to an embodiment. As shown in FIG. 1, an atomic oscillator 1 according to the first embodiment includes a semiconductor laser 10, a neutral density filter (ND filter) 11, a quarter wavelength plate 12, a gas cell 13, a light detector 14, a detector circuit 16, a voltage controlled crystal oscillator (VCXO) 17, a modulation circuit 18, a low-frequency oscillator 19, a frequency transform circuit 20, a detector circuit 21, a current control circuit 22, a low-frequency oscillator 23, a constant current circuit 24, an MPU 25, a drive circuit 27, and a frequency transform circuit 28. In addition, the atomic oscillator 1 according to the embodiment may have a configuration in which a part of the constituents (respective units) in FIG. 1 is appropriately omitted or changed or a configuration in which other constituents are added thereto.

The semiconductor laser 10 is a surface emitting laser such as a vertical cavity surface emitting laser (VCSEL) or an edge emitting laser, and light generated by the semiconductor laser 10 is incident on the neutral density filter 11.

The neutral density filter 11 allows only a part of the light emitted by the semiconductor laser 10 to penetrate therethrough, and the light which penetrates through the neutral density filter 11 is incident on the quarter wavelength plate 12.

The quarter wavelength plate 12 transforms the incident light into σ+ circularly-polarized light and allows the σ+ circularly-polarized light to penetrate therethrough, and the light which penetrates through the quarter wavelength plate 12 is incident on the gas cell 13.

The gas cell 13 is configured such that buffer gas such as neon (Ne) or argon (Ar) is encapsulated along with alkali metal atoms (sodium (Na) atoms, rubidium (Rb) atoms, cesium (Cs) atoms, or the like) in the form of a gas in a container made of a transparent member such as glass. A part of the light which is incident on the gas cell 13 penetrates through the gas cell 13 and is incident on the light detector 14.

The light detector 14 detects the light which penetrates through the gas cell 13, and outputs a detection signal in accordance with intensity of the detected light. The light detector 14 can be implemented by using a photo diode (PD) which outputs a detection signal in accordance with the intensity of received light, for example. The output signal of the light detector 14 is input to the detector circuit 16 and the detector circuit 21.

The semiconductor laser 10, the neutral density filter 11, the quarter wavelength plate 12, the gas cell 13, and the light detector 14 are accommodated in a single case body and configure a physical package 100.

The detector circuit 16 detects the output signal from the light detector 14 by using an oscillation signal from the low-frequency oscillator 19 which oscillates at a low frequency of about several Hz to about several hundred Hz. Then, an oscillation frequency of the voltage controlled crystal oscillator (VCXO) 17 is finely adjusted in accordance with a magnitude of the output signal of the detector circuit 16. The voltage controlled crystal oscillator (VCXO) 17 oscillates at a frequency from about several MHz to about several tens MHz.

The modulation circuit 18 modulates the output signal from the voltage controlled crystal oscillator (VCXO) 17 by using the oscillation signal of the low-frequency oscillator 19 (which is the same signal as the oscillation signal supplied to the detector circuit 16) as a modulation signal in order to enable detection by the detector circuit 16. The modulation circuit 18 can be implemented by a frequency mixer (mixer), a frequency modulation (FM) circuit, an amplitude modulation (AM) circuit, or the like.

The frequency transform circuit 20 frequency-transforms the output signal from the modulation circuit 18 into a signal with a half frequency of the frequency $\omega_{12}$ corresponding to the energy difference $\Delta E_{12}$ between the two ground levels of the alkali metal atoms and outputs the signal to the drive circuit 27. The frequency transform circuit 20 can be implemented by using a phase locked loop (PLL) circuit.

The detector circuit 21 detects the output signal from the light detector 14 by using the oscillation signal of the low-frequency oscillator 23 which oscillates at a low frequency of about several Hz to about several hundred Hz.

The current control circuit 22 finely adjusts a setting voltage $V_{set}$, which will be described later, in accordance with a level of the output signal from the detector circuit 21 and generates a voltage $V_{bias}$ for setting a current of the constant current circuit 24.

The constant current circuit 24 generates a bias current in accordance with the output voltage $V_{bias}$ of the current control circuit 22. The constant current circuit 24 superimposes a modulation current in accordance with the oscillation signal of the low-frequency oscillator 23 on the bias current and outputs the modulation current to the drive circuit 27 in order to enable detection by the detector circuit 21.

Figure 2:
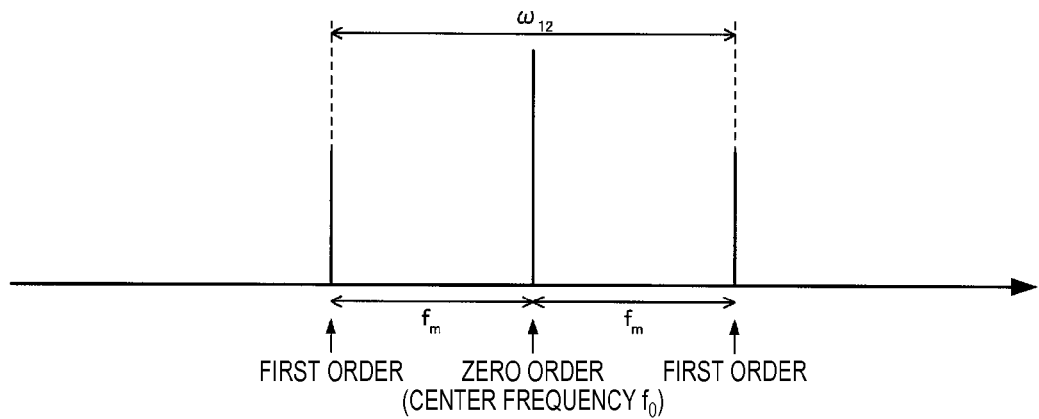
FIG. 2 is an outline diagram showing a frequency spectrum of emitted light of a semiconductor laser according to the embodiment.

The drive circuit 27 generates a drive current by frequency-modulating the bias current output from the constant current circuit 24 with the output signal from the frequency transform circuit 20 (the frequency modulation signal with a modulation frequency $f_m = \omega_{12}/2$) and supplies the drive current to the semiconductor laser 10. By the drive current, the semiconductor laser 10 generates light with a center frequency $f_0$ (center wavelength $\lambda_0$) determined depending on the bias current and light including light with a frequency $f_0 \pm f_m$ (first-order sideband light). FIG. 2 shows an example of a frequency spectrum of the light emitted by the semiconductor laser 10. In FIG. 2, the horizontal axis represents frequencies of light, and the vertical axis represents light intensity.

According to the atomic oscillator 1 configured as described above, the bias current is controlled by a feedback loop (first feedback loop) which passes through the semiconductor laser 10, the neutral density filter 11, the quarter wavelength plate 12, the gas cell 13, the light detector 14, the detector circuit 21, the current control circuit 22, the constant current circuit 24, and the drive circuit 27 such that the center frequency $f_0$ (center wavelength $\lambda_0$) of the light generated by the semiconductor laser 10 is stabilized at a desired frequency (wavelength).

In addition, control is made by a feedback loop (second feedback loop) which passes through the semiconductor laser 10, the neutral density filter 11, the quarter wavelength plate 12, the gas cell 13, the light detector 14, the detector circuit 16, the voltage controlled crystal oscillator (VCXO) 17, the modulation circuit 18, the frequency transform circuit 20, and the drive circuit 27 such that the light with the frequency $f_0+f_m$ and the light with the frequency $f_0-f_m$ (first-order sideband light pair) function as the resonance light pair which causes the EIT phenomenon in the alkali metal atoms encapsulated in the gas cell 13. Specifically, feedback control is made by the second feedback loop such that a frequency difference ($=2f_m$) between the light with the frequency $f_0+f_m$ and the light with the frequency $f_0-f_m$ completely coincides with the frequency $\omega_{12}$ corresponding to the energy difference $\Delta E_{12}$ between the two ground levels of the alkali metal atoms.

By utilizing the EIT phenomenon of the alkali metal atoms as described above, the output signal from the frequency transform circuit 20 and the output signal from the voltage controlled crystal oscillator (VCXO) 17 included in the second feedback loop are stabilized at constant frequencies.

The frequency transform circuit 28 frequency-transforms the output signal from the voltage controlled crystal oscillator (VCXO) 17 and generates a clock signal with a desired frequency (10.00 . . . MHz, for example). The clock signal is externally output. The frequency transform circuit 20 can be implemented by a direct digital synthesizer (DDS), for example.

The atomic oscillator 1 with the configuration as described above causes significantly small deviations in oscillation frequency and can realize high short-term stability.

Phase Detection

In this embodiment, the detector circuit 21 performs detection based on a phase detection scheme, and control is made such that the center frequency $f_0$ (center wavelength $\lambda_0$) of the light emitted by the semiconductor laser 10 is stabilized at a desired frequency (wavelength) in the aforementioned first feedback loop. A detailed description will be given of the phase detection according to this embodiment with reference to FIGS. 3, 4A and 4B.

Figure 3:
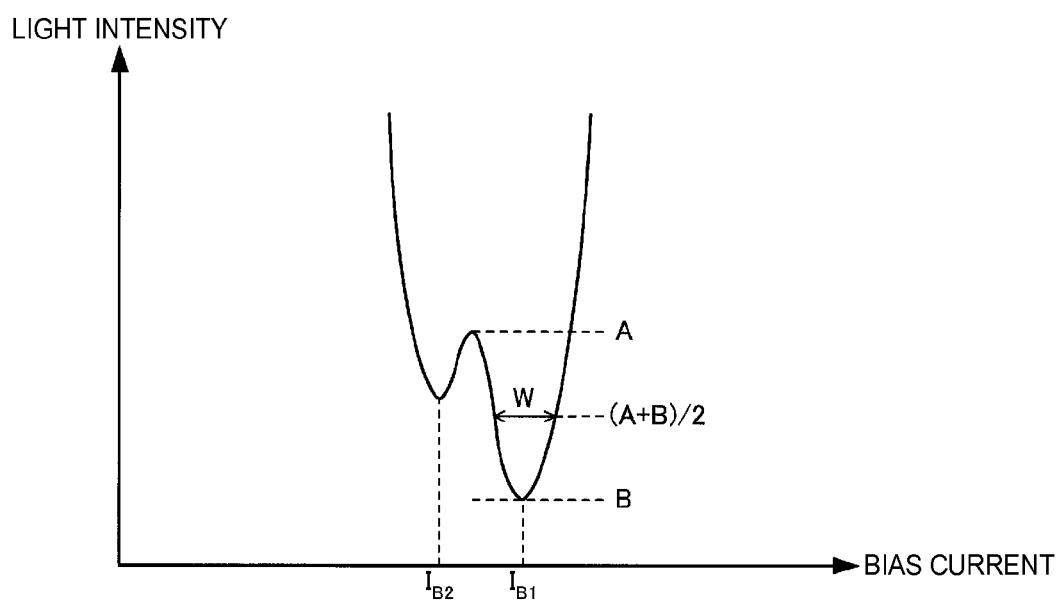
FIG. 3 is a diagram showing a relationship between a bias current and intensity of light which penetrates through a gas cell.

FIG. 3 is a diagram showing a relationship (a transmission property or an absorption property) between the bias current supplied to the semiconductor laser 10 and the intensity of the light which penetrates through the gas cell 13 (the light detected by the light detector 14), and a property in the vicinity of minimum light intensity is shown in FIG. 3. Although the EIT signal is observed in the output from the light detector 14 in practice, the EIT signal is omitted in FIG. 3.

The first-order sideband light pair emitted by the semiconductor laser 10 is absorbed by the gas cell 13, and a band where the intensity of the transmitted light is low, namely a large absorption band is present. However, the absorption band has two peaks (transmitted light intensity minimum points) when the bias currents are $I_{B1}$ and $I_{B2}$ ($<I_{B1}$) as shown in FIG. 3, and the intensity of the transmitted light reaches the minimum value when the bias current is $I_{B1}$ (the bias current with the higher center frequency $f_0$ (shorter center wavelength $\lambda_0$)). Since S/N of the EIT signal increases and the frequency stability of the atomic oscillator 1 is enhanced by generating the EIT signal at a minimum point of the absorption band, it is preferable to control the bias current so as to minimize the intensity of the transmitted light. In this embodiment, the bias current is controlled so as to minimize the intensity of the light detected by the light detector 14 (the intensity of the light transmitted by the gas cell 13) by setting the bias current in the vicinity of the minimum point of the absorption band in the bias current automatic setting processing, which will be described later, further modulating the bias current with the oscillation signal of the low-frequency oscillator 23, and causing the detector circuit 21 to perform phase detection on the output signal from the light detector 14 by using the oscillation signal of the low-frequency oscillator 23.

Figure 4A:
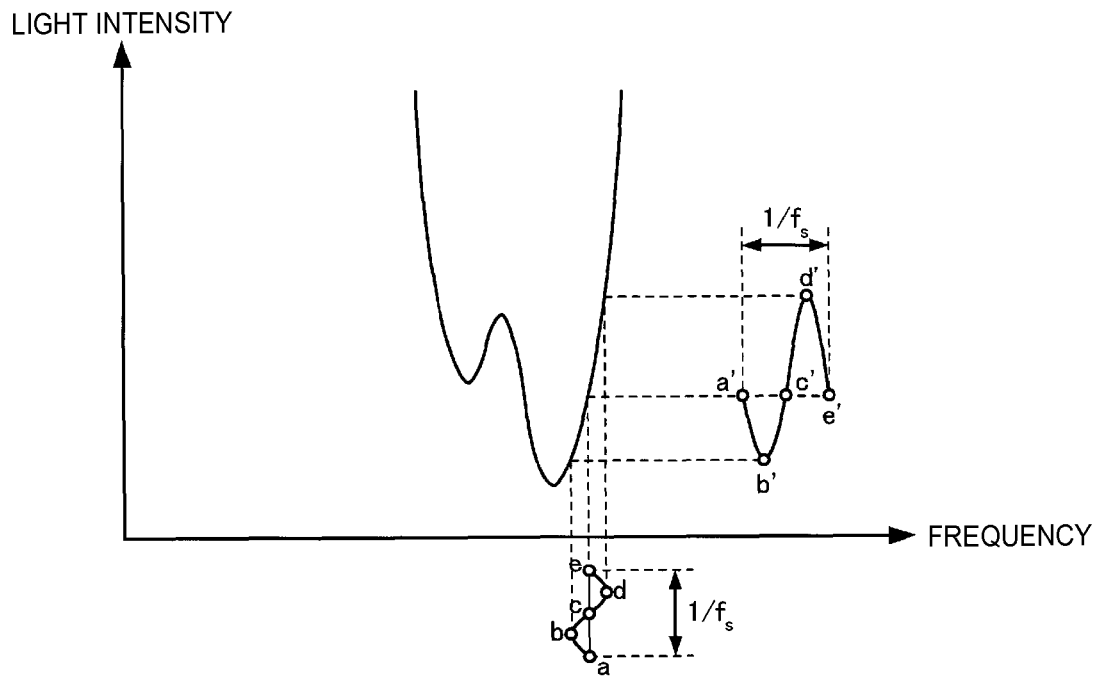
FIGS. 4A and 4B are diagrams illustrating a principle of phase detection.
Figure 4B:
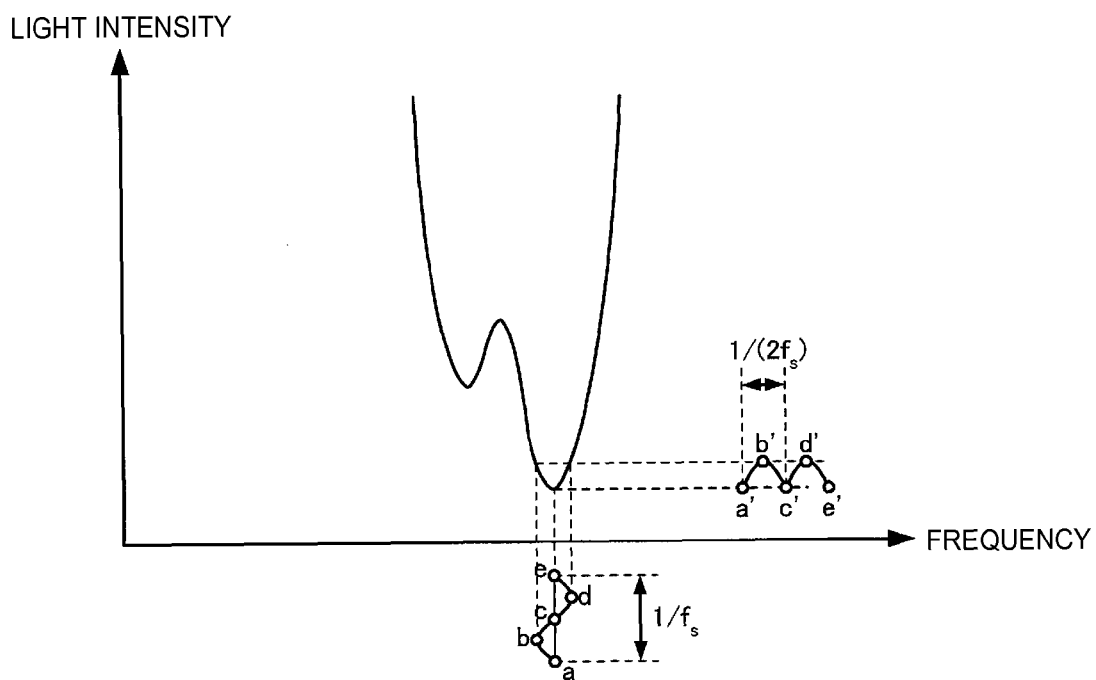

A description will be given of a principle of the phase detection with reference to FIGS. 4A and 4B. In FIGS. 4A and 4B, the horizontal axes represent the center frequency $f_0$ of the light emitted by the semiconductor laser 10, and the vertical axes represent the intensity of the light which penetrates through the gas cell 13.

When the center frequency $f_0$ deviates to a side which is higher than the peak (minimum point) of the absorption band as shown in FIG. 4A, the respective points a, b, c, d, and e of a sine wave (an oscillation signal of the low-frequency oscillator 23) with a frequency $f_s$ (cycle $1/f_s$) appear as the respective points a', b', c', d', and e' in an output of the light detector 14, and therefore, the output signal from the light detector 14 includes a lot of frequency components of $f_s$. Therefore, the detection circuit 21 can extract a negative direct current signal by inverting only the polarities of the output signal from the light detector 14 at c' to e' corresponding to a half cycle around voltages at a', c', and e' by using a rectangular wave (the oscillation signal of the low-frequency oscillator 23) with a frequency $f_s$ (cycle $1/f_s$) in the same phase as that of the output signal of the light detector 14 and then integrating the output signal with a filter. The current control circuit 22 lowers $V_{bias}$ and lowers the bias current to be output by the constant current circuit 24 when the output voltage of the detector circuit 21 is negative. With such a configuration, the center frequency $f_0$ is lowered and approaches the minimum point of the absorption band. If the center frequency $f_0$ deviates to a lower side than the minimum point of the absorption band, then the output voltage of the detector circuit 21 is positive, and the current control circuit 22 increases $V_{bias}$ and increases the bias current to be output by the constant current circuit 24, though not shown in the drawing. Therefore, the center frequency $f_0$ increases and approaches the minimum point of the absorption band.

When the center frequency $f_0$ coincides with the minimum point of the absorption band as shown in FIG. 4B, the output signal from the light detector 14 includes a lot of frequency components of $2f_s$, and the shape approaches a bilaterally symmetric shape about the c' point. For this reason, if the detector circuit 21 inverts only the polarities of an output signal from the light detector 14 at c' to e' corresponding to the half cycle around the voltage of a', c, and e' by using the rectangular wave (the oscillation signal of the low-frequency oscillator 23) with the frequency $f_s$ (cycle $1/f_s$) in the same phase as that of the output signal from the light detector 14 and integrates the output signal with the filter, substantially zero is acquired (voltage at a', c', and e'). The current control circuit 22 does not change $V_{bias}$ and maintains the bias current output from the constant current circuit 24 when the output voltage of the detector circuit 21 is zero. With such a configuration, the center frequency $f_0$ does not vary and is stabilized at the minimum point of the absorption band.

Although the center frequency $f_0$ is stabilized at a minimum point of the bias current setting value absorption band in this phase detection, at which of the two minimum points the center frequency $f_0$ is stabilized depends of the bias current setting value. Thus, in order to stabilize the center frequency $f_0$ at a minimum point by the phase detection, the bias current is set in the vicinity of the minimum point of the absorption band by the bias current automatic setting processing in this embodiment.

In addition, it is preferable to set a modulation width (modulation depth) to about a half of a width W of the peak in order to enhance sensitivity of the phase detection. As shown in FIG. 3, the width W of the peak is defined as a width of a peak when the intensity of the transmitted light is equal to an average value (A+B)/2 of intensity A at the minimum point and intensity B at the maximum point. The modulation width (modulation depth) is proportional to amplitude of the oscillation signal of the low-frequency oscillator 23.

Bias Current Automatic Setting

According to the aforementioned principle of the phase detection, the center frequency is stabilized at a peak (minimum point) which is not a minimum point of the absorption band in a case where the bias current is set in the vicinity of $I_{B2}$, and S/N of the EIT signal deteriorates. Thus, the atomic oscillator 1 according to this embodiment has a function of automatically setting the bias current to be supplied to the semiconductor laser 10 so as to always stabilize (lock) the center frequency at the minimum point of the absorption band.

In order to implement the function of automatically setting the bias current, the atomic oscillator 1 according to this embodiment is configured such that the MPU 25 performs sweep processing of sweeping the bias current to be supplied to the semiconductor laser 10 and storing on a memory 26 a bias current value (specifically, an A/D conversion value of an output voltage $V_{bias}$ of the current control circuit 22) and a value of light intensity (specifically an A/D conversion value of an output voltage of the light detector 14) when the light intensity reaches the minimum value while the intensity of the light detected by the light detector 14 shifts from a decrease to an increase.

According to this embodiment, the current control circuit 22 is configured to be able to repeat operations of sweeping $V_{bias}$ from a first voltage V' (0 V, for example) to a second voltage $V_2$ (2.7 V, for example) and then sweeping $V_{bias}$ from the second voltage $V_2$ to the first voltage $V_1$ in the opposite direction, and the MPU 25 instructs the current control circuit 22 to start or stop the sweeping operation.

After the sweep processing, the MPU 25 performs re-sweep determination processing of setting the bias current of the semiconductor laser 10 based on the value of the bias current stored on the memory 26, comparing the value of the intensity of the light detected by the light detector 14 with the value of the intensity of the light stored on the memory 26 in the sweep processing in a state where the bias current is controlled and stabilized (locked) by the first feedback loop, and determining whether to perform the sweep processing again in accordance with a comparison result. For example, the MPU 25 may determine to perform the sweep processing again in the re-sweep determination processing in a case where a difference or a ratio between the value of the intensity of the light detected by the light detector 14 and the value of the intensity of the light stored on the memory 26 is greater than a threshold value stored on the memory 26.

Alternatively, the MPU 25 may compare the value of the bias current and the value of the bias current stored on the memory 26 in the sweep processing in a state where the bias current is controlled and stabilized (locked) by the first feedback loop and determine whether to perform the sweep processing again in accordance with the comparison result in the re-sweep determination processing. For example, the MPU 25 may determine to perform the sweep processing again in the re-sweep determination processing when a difference or a ratio between the value of the bias current to be supplied to the semiconductor laser 10 and the value of the bias current stored on the memory 26 is greater than a threshold value stored on the memory 26.

The MPU 25 may perform the re-sweep determination processing every time the sweep processing is performed and repeat the sweep processing until it is determined not to perform the sweep processing in the re-sweep determination processing.

Figure 5:
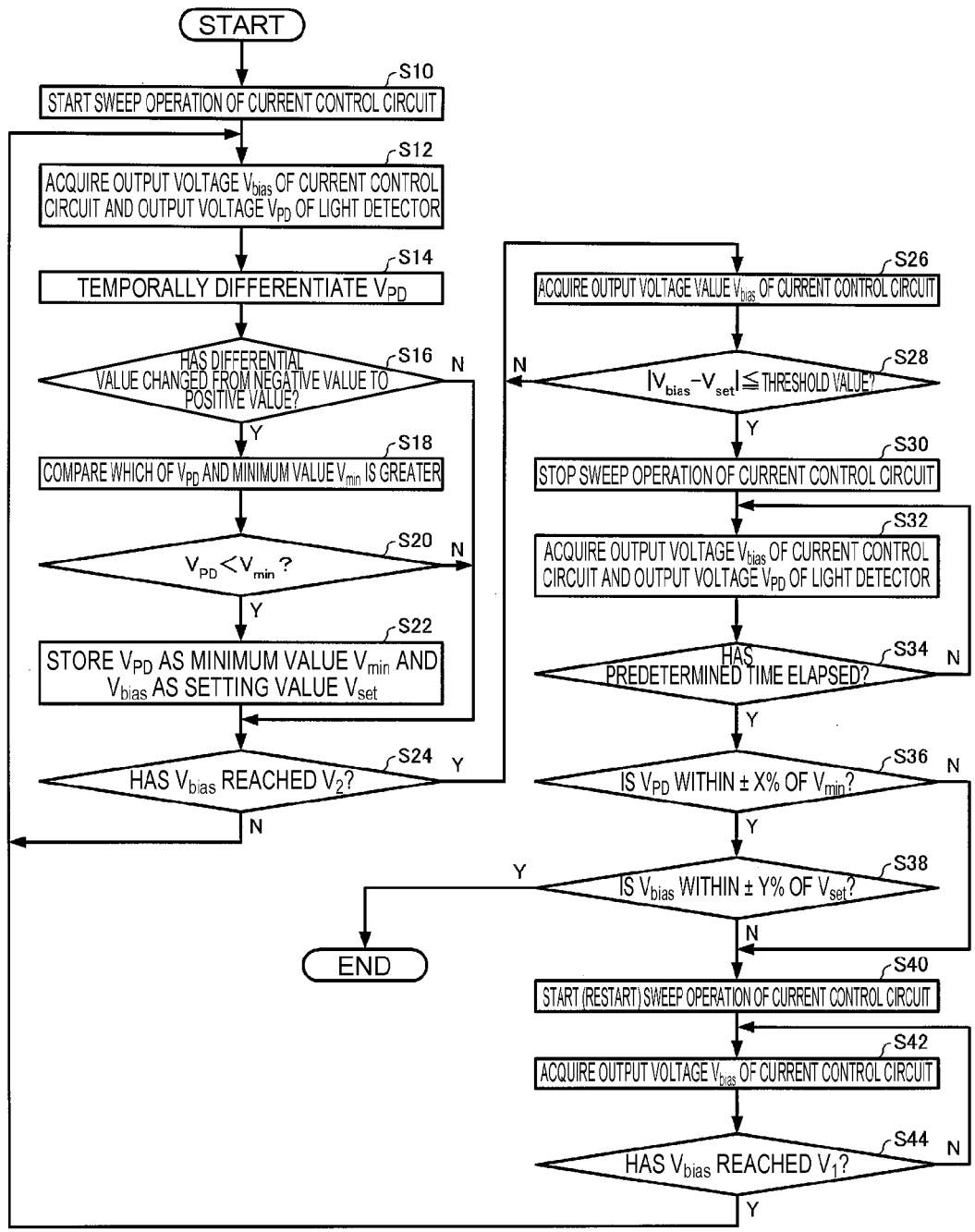
FIG. 5 is a flowchart of bias current automatic setting processing according to a first embodiment.

FIG. 5 is a diagram showing an example of a detailed flowchart of the bias current automatic setting processing by the MPU 25. If power is supplied to the atomic oscillator 1, the MPU 25 starts the sweep operation of the current control circuit 22 first in the flowchart of FIG. 5 (S10). An initial value of the output voltage $V_{bias}$ of the current control circuit 22 is the first voltage $V_1$, and $V_{bias}$ gradually increases to the second voltage $V_2$.

Next, the MPU 25 acquires the output voltage $V_{bias}$ of the current control circuit 22 and the output voltage $V_{PD}$ of the light detector (S12) and differentiates $V_{PD}$ (S14). Specifically, the MPU 25 incorporates an A/D converter therein, acquires $V_{bias}$ and $V_{PD}$ at a predetermined sampling rate, stores digital data obtained by performing A/D conversion on $V_{bias}$ and $V_{PD}$ on the memory 26, and calculates a temporal differentiation of the digital data of $V_{PD}$ (a difference from the last data previously sampled, in practice).

Then, the MPU 25 determines whether or not the differential value of $V_{PD}$ calculated in Step S14 has changed from a negative value to a positive value (S16).

When the differential value of $V_{PD}$ has not changed from a negative value to a positive value (N in S16), then the MPU 25 determines whether or not $V_{bias}$ has reached $V_2$ (S24).

In contrast, when the differential value of $V_{PD}$ has changed from a negative value to a positive value (Y in S16), the MPU 25 compares which of $V_{PD}$ and the minimum value $V_{min}$ is greater (S18). Here, an initial value of the minimum value $V_{min}$ is set to $V_2$, and $V_{PD} < V_{min}$ is always satisfied when the differential value of $V_{PD}$ changes from a negative value to a positive value first.

When $V_{PD} < V_{min}$ (Y in S20), the MPU 25 stores $V_{PD}$ as $V_{min}$ and $V_{bias}$ acquired with $V_{PD}$ at the same time in Step S12 as a setting value $V_{set}$ on the memory 26 (S22) and determines whether or not $V_{bias}$ has reached $V_2$ (S24). In addition, when $V_{PD} \geq V_{min}$ (N in S20), the MPU 25 determines whether or not $V_{bias}$ has reached $V_2$ without performing the processing in Step S22 (S24).

If $V_{bias}$ has not reached $V_2$ in Step S24 (N in S24), the MPU 25 performs the processing in Step S12 and the following processing again. In contrast, if $V_{bias}$ has reached $V_2$ (Y in S24), the MPU 25 performs processing in Step S26 and the following processing.

Figure 6:
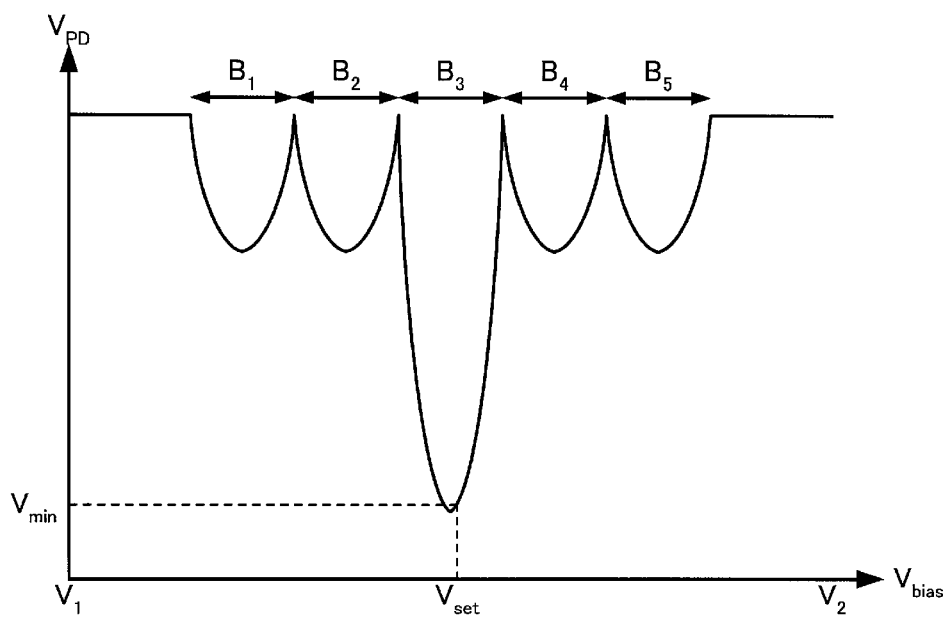
FIG. 6 is a diagram showing an example of an output voltage of a light detector in sweep processing.

As described above, the MPU 25 searches for the minimum point, at which the differential value of $V_{PD}$ changes from a negative value to a positive value, while sweeping $V_{bias}$ from $V_1$ to $V_2$ by repeating the processing in Steps S12 to S24 and stores $V_{PD}$ and $V_{bias}$ at the minimum point during the search as $V_{min}$ and $V_{set}$ on the memory 26. FIG. 6 shows $V_{PD}$ acquired while $V_{bias}$ is swept from $V_1$ to $V_2$. In this embodiment, the semiconductor laser 10 generates the light with the center frequency $f_0$ and the first-order sideband light pair with the frequency $f_0 \pm f_m$ as shown in FIG. 2, and the first-order sideband light pair is the resonance light pair. Therefore, if $V_{bias}$ is swept from $V_1$ to $V_2$, five absorption bands, namely an absorption band $B_1$ in which only the light of $f_0+f_m$ is absorbed, an absorption band $B_2$ in which only the light of $f_0$ is absorbed, an absorption band $B_3$ in which the light of $f_0+f_m$ and the light of $f_0-f_m$ are absorbed, an absorption band $B_4$ in which only the light of $f_0$ is absorbed, and an absorption band $B_5$ in which only the light of $f_0-f_m$ is absorbed are observed in this order. $V_{PD}$ at the minimum point of the third absorption band $B_3$ is the smallest, $V_{set}$ is a value which is slightly higher than the minimum point, and $V_{min}$ is a value which is slightly higher than the minimum value.

If the processing in Steps S12 to S24 is completed, then the MPU 25 acquires the output voltage value $V_{bias}$ of the current control circuit 22 (S26) and determines whether or not $|V_{bias}-V_{set}|$ is equal to or less than a threshold value (S28). If $|V_{bias}-V_{set}|$ is greater than the threshold value (N in S28), the MPU 25 performs the processing in Step S26 again. If $|V_{bias}-V_{set}|$ is equal to or less than the threshold value (Y in Step S28), the MPU 25 performs processing in Step S30 and the following processing. In short, since the current control circuit 22 starts the sweep operation in the opposite direction so as to gradually lower $V_{bias}$ up to $V_1$ after $V_{bias}$ reaches $V_2$, the MPU 25 waits until $V_{bias}$ approaches $V_{set}$ in Steps S26 and S28. In addition, a reason that the MPU 25 determines whether or not $|V_{bias}-V_{set}|$ is equal to or less than the threshold value in Step S28 is because the value of $V_{bias}$ acquired by the MPU 25 does not always coincide with $V_{set}$ depending on a sampling timing. Accordingly, the threshold value is set to a value with which it is possible to detect that $V_{bias}$ approaches $V_{set}$ to the maximum extent, in consideration of a value of $V_{bias}$ when the sampling timing deviates to the maximum extent.

If $|V_{bias}-V_{set}|$ is equal to or less than the threshold value (Y in S28), the MPU 25 stops the sweep operation by the current control circuit 22 (S30). With such a configuration, $V_{bias}$ is set to a voltage in the vicinity of $V_{set}$ at a moment when the sweep operation is stopped, but however, $V_{bias}$ varies since control is performed based on the aforementioned phase detection so as to achieve the stabilization (locking) at the minimum point of the absorption band.

Thus, the MPU 25 acquires the output voltage $V_{bias}$ of the current control circuit 22 and the output voltage $V_{PD}$ of the light detector 14 (S32), and at the same time, waits until a predetermined time elapses (N in S34). In short, the MPU 25 waits until $V_{bias}$ controlled based on the phase detection is stabilized. Accordingly, the predetermined time in Step S34 is set to be equal to or greater than a time required for stabilizing $V_{bias}$.

If the predetermined time has elapsed (Y in S34), the MPU 25 determines whether or not $V_{PD}$ is within $\pm X$ % of $V_{min}$ and whether or not $V_{bias}$ is within $\pm Y$ % of $V_{set}$ (S36, S38). The threshold values (the values of X and Y) are stored on the memory 26, for example.

When $V_{PD}$ is within $\pm X$ % of $V_{min}$ and $V_{bias}$ is within $\pm Y$ % of $V_{set}$ (Y in S36 and Y in S38), the MPU 25 completes the bias current automatic setting processing. In short, when a difference or a ratio between $V_{PD}$ and $V_{min}$ is relatively small and a difference or a ratio between $V_{bias}$ and $V_{set}$ is relatively small, the MPU 25 determines that the bias current was able to be stabilized (locked) at the minimum point of the absorption band $B_3$ and completes the bias current automatic setting processing. In consideration of variations in circumferential environment and influences of noise and the like, the MPU 25 completes the bias current automatic setting processing when $V_{PD}$ is within $\pm 40$% of $V_{min}$ and $V_{bias}$ is within $\pm 40$% of $V_{set}$, for example.

In contrast, when $V_{PD}$ is not within $\pm X$ % of $V_{min}$ or $V_{bias}$ is not within $\pm Y$ % of $V_{set}$ (N in S36 or N in S38), the MPU 25 starts (restarts) the sweep operation by the current control circuit 22 (S40). With such a configuration, the current control circuit 22 restarts the sweep operation for gradually lowering $V_{bias}$ to $V_1$.

Next, the MPU 25 acquires the output voltage value $V_{bias}$ of the current control circuit 22 (S42), determines whether or not $V_{bias}$ has reached $V_1$ (S44), and if $V_{bias}$ has not reached $V_1$ (N in S44), performs the processing in Step S42 again, and if $V_{bias}$ has reached $V_1$ (Y in S44), performs the processing in Step S12 and the following processing again. In short, the MPU 25 performs the processing in Step S12 and the following processing again after waiting until $V_{bias}$ reaches $V_1$ in Steps S42 and S44. In addition, the MPU 25 rewrites $V_{min}$, which is stored on the memory 26, with $V_2$ at an arbitrary timing before the processing in Step S12 is performed again.

By the MPU 25 performing the re-sweep determination processing (the processing in Steps S26 to S38) every time the sweep processing (the processing in Steps S12 to S24) is performed as described above, the bias current is automatically set such that the center frequency $f_0$ coincides with the minimum point of the absorption band.

In addition, if the current control circuit 22 is configured to be able to output a voltage corresponding to a setting value of $V_{bias}$ immediately after receiving the setting value from the MPU 25, the processing in Steps S26 to S30 may be replaced with processing of supplying the setting value $V_{set}$ from the MPU 25 to the current control circuit 22. Similarly, the processing in Steps S40 to S44 may be replaced with processing of supplying the setting value $V_1$ from the MPU 25 to the current control circuit 22.

Figure 7A:
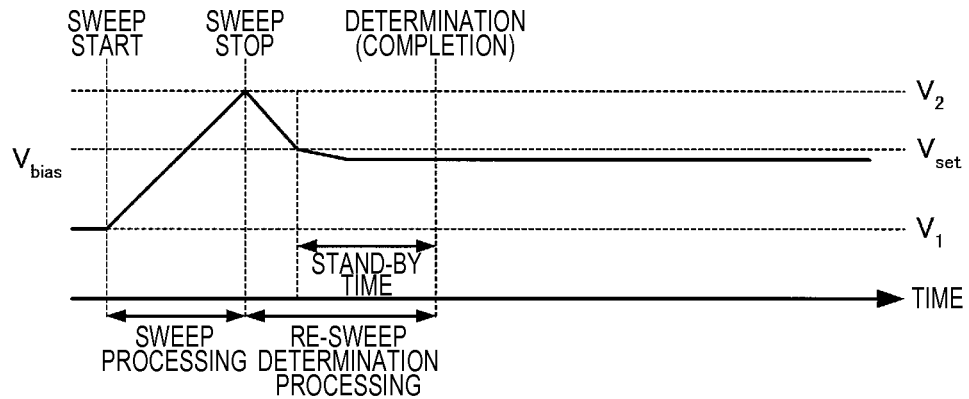
FIGS. 7A and 7B are diagrams showing an example of an output voltage of a current control circuit in the bias current automatic setting processing.
Figure 7B:
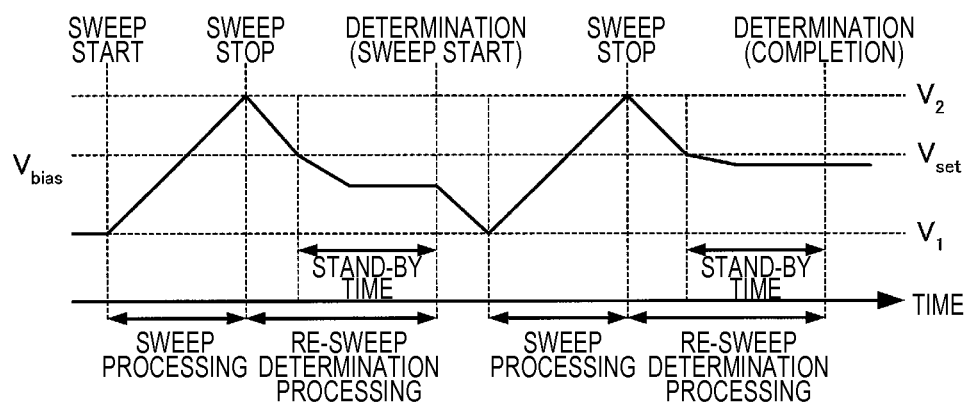

FIGS. 7A and 7B show examples of behaviors of $V_{bias}$ in the bias current automatic setting processing. FIG. 7A shows an example in which the sweep processing is completed after being performed once, and FIG. 7B shows an example in which the sweep processing is completed after being performed twice.

According to the atomic oscillator of the first embodiment, $V_{bias}$ and $V_{PD}$ in the vicinity of the minimum point of the light absorption band of the gas cell 13 are stored as $V_{set}$ and $V_{min}$, respectively, on the memory 26 in the sweep processing, it is determined that the sweep processing is not to be performed again if the difference (ratio) between acquired $V_{PD}$ and $V_{min}$ is within the predetermined range and the difference between (ratio) the acquired $V_{bias}$ and $V_{set}$ is within the predetermined range in the state where $V_{bias}$ is set to $V_{set}$ and is stabilized (locked), and it is determined that the sweep processing is to be performed again in the other cases in the re-sweep determination processing as described above. With such a configuration, the sweep processing is repeated as long as necessary, and the bias current is automatically set so as to be stabilized in the vicinity of the minimum point of the absorption band. Therefore, according to the atomic oscillator of the first embodiment, it is possible to acquire an EIT signal with high S/N and to enhance the frequency stability.

In FIG. 1, the constituents (circuits) other than the physical package 100 may be implemented by a chip of integrated circuit (IC) or by a plurality of IC chips, for example.

In FIG. 1, the semiconductor laser 10, the gas cell 13, and the light detector 14 correspond to the "light source", the "cell", and the "light detecting section", respectively according to the invention. In addition, the circuit configured of the detector circuit 21, the current control circuit 22, the constant current circuit 24, and the drive circuit 27 corresponds to the "bias current control section" according to the invention. Moreover, the MPU 25 corresponds to the "bias current setting section" according to the invention. Furthermore, the memory 26 corresponds to the "storage section" according to the invention.

1-2. Second Embodiment

According to the atomic oscillator 1 of a second embodiment, the MPU 25 determines whether or not it is necessary to change the setting of the bias current before the initial sweep processing in the bias current automatic setting processing and performs the sweep processing and the re-sweep determination processing only when necessary. Since the configuration of the atomic oscillator 1 of the second embodiment is the same as that of the first embodiment (FIG. 1), the depiction and the description thereof will be omitted. In addition, since functions of the respective parts other than the MPU 25 are the same as those in the first embodiment, the description thereof will be omitted.

In this embodiment, the MPU 25 performs adjustment determination processing of setting the bias current to be supplied to the semiconductor laser 10 before the sweep processing, comparing the value of the intensity of the light detected by the light detector 14 with the value of the intensity of the light stored on the memory 26 in the state where the bias current is controlled and stabilized (locked) by the first feedback loop, and determining whether or not to perform the sweep processing in accordance with the comparison result. For example, the MPU 25 may determine to perform the sweep processing when a difference or a ratio between the value of the intensity of the light detected by the light detector 14 and the value of the intensity of the light stored on the memory 26 is greater than a threshold value in the adjustment determination processing.

In addition, the MPU 25 may compare the value of the bias current and the value of the bias current stored on the memory 26 in the state where the bias current is controlled and stabilized (locked) by the first feedback loop and determine whether or not to perform the sweep processing in accordance with the comparison result in the adjustment determination processing. For example, the MPU 25 may determine to perform the sweep processing when the difference or the ratio between the value of the bias current to be supplied to the semiconductor laser 10 and the value of the bias current stored on the memory 26 is greater than a threshold value in the adjustment determination processing.

In addition, the memory 26 may be a non-volatile memory such as an electrically erasable programmable read-only memory (EEPROM), and the MPU 25 may perform the adjustment determination processing by using the value of the intensity of the light and the bias current stored on the memory 26 when the power source is activated.

Figure 8:
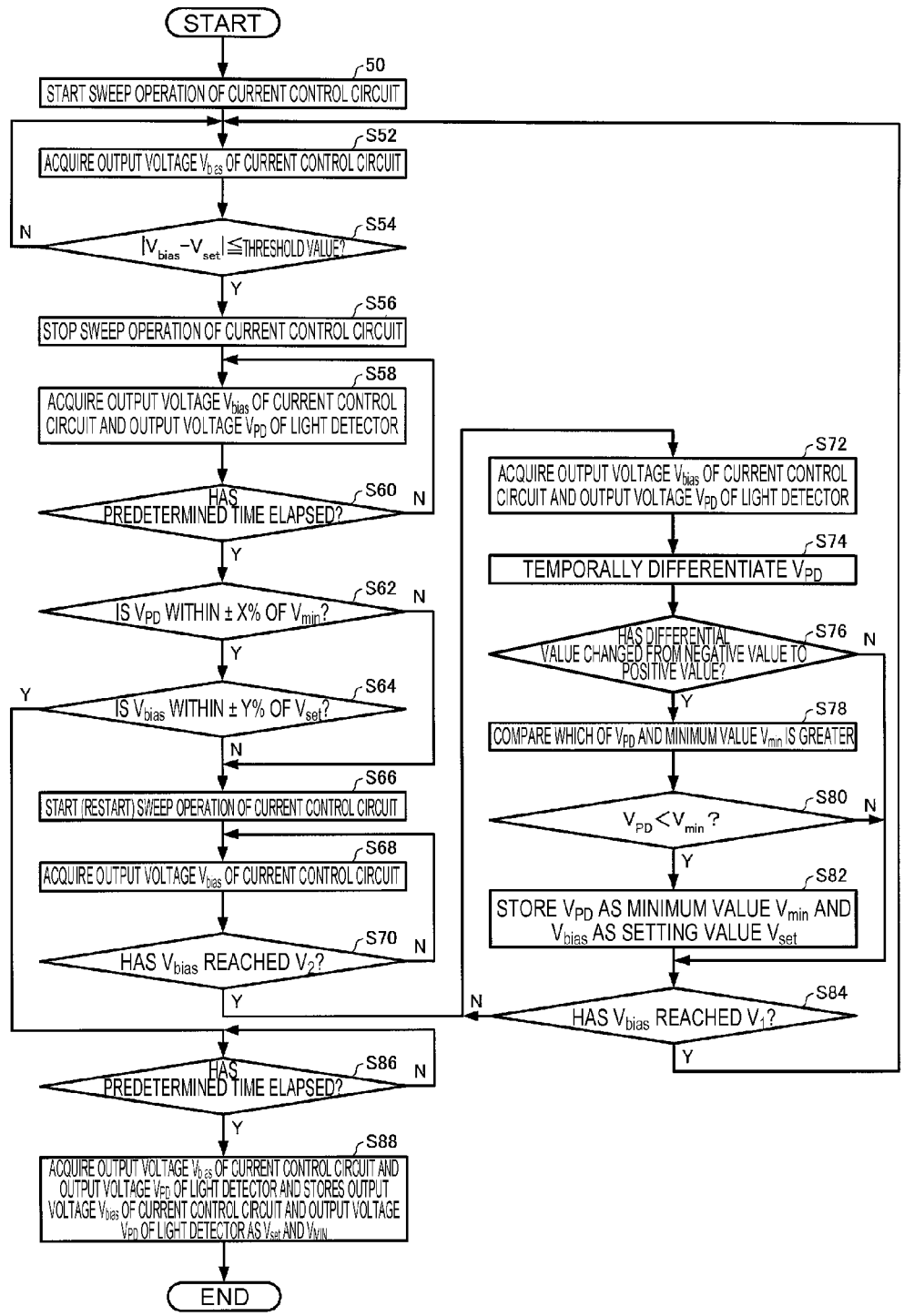
FIG. 8 is a flowchart of bias current automatic setting processing according to a second embodiment.

FIG. 8 is a diagram showing an example of a detailed flowchart of the bias current automatic setting processing by the MPU 25. In the flowchart of FIG. 8, the MPU 25 starts the sweep operation of the current control circuit 22 first after power is supplied to the atomic oscillator 1 (S50). The initial value of the output voltage $V_{bias}$ of the current control circuit 22 is the first voltage $V_1$ (0 V, for example), and $V_{bias}$ gradually increases up to the second voltage $V_2$ (2.7 V, for example).

The MPU 25 then acquires the output voltage value $V_{bias}$ of the current control circuit 22 (S52) and determines whether or not $|V_{bias}-V_{set}|$ is equal to or less than a threshold value (S54). $V_{set}$ is a setting value of the $V_{bias}$ acquired in the previous automatic setting processing and is stored on the non-volatile memory 26.

The MPU 25 performs the processing in Step S52 again if $|V_{bias}-V_{set}|$ is greater than the threshold value (N in S54), and performs the processing in Step S56 and the following processing if $|V_{bias}-V_{set}|$ is equal to or less than the threshold value (Y in S54). In short, the current control circuit 22 starts the sweep operation such that $V_{bias}$ gradually increases from $V_1$, and therefore, the MPU 25 waits until $V_{bias}$ approaches the initial setting value $V_{set}$ in Steps S52 and S54. In addition, a reason that the MPU 25 determines whether or not $|V_{bias}-V_{set}|$ is equal to or less than the threshold value in Step S54 is because the value of $V_{bias}$ acquired by the MPU 25 does not always coincide with the value of $V_{set}$ depending on a sampling timing. Therefore, the threshold is set to a value with which it is possible to detect that $V_{bias}$ has approached $V_{set}$ to the maximum extent, in consideration of the value of $V_{bias}$ when the sampling timing deviates to the maximum extent.

If $|V_{bias}-V_{set}|$ is equal to or less than the threshold value (Y in S54), the MPU 25 stops the sweep operation of the current control circuit 22 (S56). With such a configuration, $V_{bias}$ is set to a voltage in the vicinity of $V_{set}$ at a moment when the sweep operation is stopped, but however, $V_{bias}$ varies since control is performed based on the aforementioned phase detection so as to achieve the stabilization (locking) at the minimum point of the absorption band.

Thus, the MPU 25 acquires the output voltage $V_{bias}$ of the current control circuit 22 and the output voltage $V_{PD}$ of the light detector 14 (S58), and at the same time, waits until a predetermined time elapses (N in S60). In short, the MPU 25 waits until $V_{bias}$ controlled based on the phase detection is stabilized. Accordingly, the predetermined time in Step S60 is set to be equal to or greater than a time required for stabilizing $V_{bias}$.

If the predetermined time has elapsed (Y in S60), the MPU 25 determines whether or not $V_{PD}$ is within ±X % of $V_{min}$ and whether or not $V_{bias}$ is within ±Y % of $V_{set}$ (S62, S64). $V_{min}$ is the minimum value of $V_{PD}$ acquired in the previous automatic setting processing and is stored on the non-volatile memory 26. In addition, the threshold values (the values of X and Y) are stored on the memory 26, for example.

When $V_{PD}$ is within ±X % of $V_{min}$ and $V_{bias}$ is within ±Y % of $V_{set}$ (Y in S62 and Y in S64), the MPU 25 acquires the output voltage $V_{bias}$ of the current control circuit 22 and the output voltage $V_{PD}$ of the light detector 14 after the predetermined time elapses (Y in S86), stores the output voltage $V_{bias}$ and the output voltage $V_{PD}$ as $V_{set}$ and $V_{min}$ on the memory 26 (S88), and completes the bias current automatic setting processing. In short, when a difference or a ratio between $V_{PD}$ and $V_{min}$ is relatively small and a difference or a ratio between $V_{bias}$ and $V_{set}$ is relatively small, the MPU 25 determines that the bias current was able to be stabilized (locked) at the minimum point of the absorption band $B_3$ and completes the bias current automatic setting processing. In consideration of variations in circumferential environment and influences of noise and the like, the MPU 25 completes the bias current automatic setting processing when $V_{PD}$ is within ±40% of $V_{min}$ and $V_{bias}$ is within ±40% of $V_{set}$, for example. Although the processing in Steps S86 and S88 is performed in order to store more appropriate data on the memory 26 since $V_{bias}$ and $V_{PD}$ after the predetermined time (several hours, for example) elapses are different from $V_{set}$ and $V_{min}$, respectively, in the state where the stabilization (locking) is achieved at the minimum point of the absorption band $B_3$, it is not necessary to perform the processing in Steps S86 and S88.

In contrast, when $V_{PD}$ is not within ±X % of $V_{min}$ or $V_{bias}$ is not within ±Y % of $V_{set}$ (N in S62 or N in S64), the MPU 25 starts (restarts) the sweep operation by the current control circuit 22 (S66). With such a configuration, the current control circuit 22 restarts the sweep operation for gradually increasing $V_{bias}$ to $V_2$.

Next, the MPU 25 acquires the output voltage value $V_{bias}$ of the current control circuit 22 (S68), determines whether or not $V_{bias}$ has reached $V_2$ (S70), and if $V_{bias}$ has not reached $V_2$ (N in S70), performs the processing in Step S68 again, and if $V_{bias}$ has reached $V_2$ (Y in S70), performs the processing in Step S72 and the following processing. In short, the MPU 25 performs the processing in Step S72 and the following processing after waiting until $V_{bias}$ reaches $V_2$ in Steps S68 and S70. In addition, the MPU 25 rewrites $V_{min}$, which is stored on the memory 26, with $V_2$ at an arbitrary timing before the processing in Step S70.

Then, the MPU 25 acquires the output voltage $V_{bias}$ of the current control circuit 22 and the output voltage $V_{PD}$ of the light detector (S72) and differentiates $V_{PD}$ (S74).

Next, the MPU 25 determines whether or not the differential value of $V_{PD}$ calculated in Step S74 has changed from a negative value to a positive value (S76).

If the differential value of $V_{PD}$ has not changed from a negative value to a positive value (N in S76), the MPU 25 determines whether or not $V_{bias}$ has reached V' (S84).

In contrast, if the differential value of $V_{PD}$ has changed from a negative value to a positive value (Y in S76), the MPU 25 compares which of $V_{PD}$ and the minimum value $V_{min}$ is greater (S78). Here, the minimum value $V_{min}$ is set to $V_2$, and $V_{PD}<V_{min}$ is always satisfied when the differential value of $V_{PD}$ changes from a negative value to a positive value for the first time.

When $V_{PD}<V_{min}$ (Y in S80), the MPU 25 stores $V_{PD}$ as $V_{min}$ and $V_{bias}$ acquired with $V_{PD}$ at the same time in Step S72 as the setting value $V_{set}$ on the memory 26 (S82) and determines whether or not $V_{bias}$ has reached $V_1$ (S84). In addition, when $V_{PD} \geq V_{min}$ (N in S80), the MPU 25 determines whether or not $V_{bias}$ has reached $V_1$ without performing the processing in Step S82 (S84). When the processing in Steps S86 and S88 is performed, $V_{min}$ and $V_{set}$ may be stored in the non-volatile memory in Step S82.

If $V_{bias}$ has not reached $V_1$ in Step S84 (N in S84), the MPU 25 performs the processing in Step S72 and the following processing again. In contrast, if $V_{bias}$ has reached $V_1$ (Y in S84), the MPU 25 performs the processing in Step S52 and the following processing.

Figure 9:
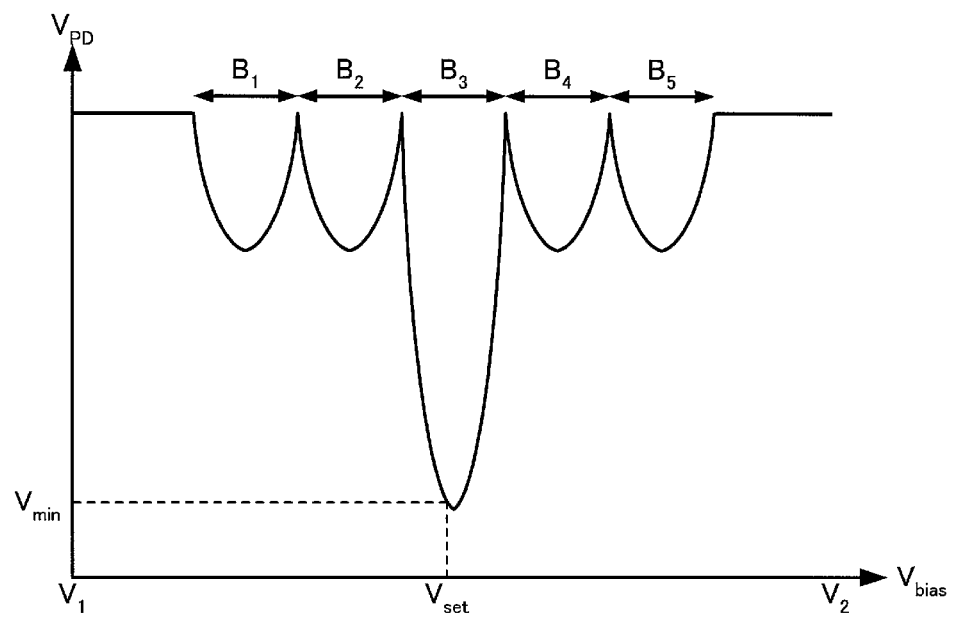
FIG. 9 is a diagram showing an example of an output voltage of a light detector in the sweep processing.

As described above, the MPU 25 searches for the minimum point, at which the differential value of $V_{PD}$ changes from a negative value to a positive value, while sweeping $V_{bias}$ from $V_2$ to $V_1$ by repeating the processing in Steps S72 to S84 and stores $V_{PD}$ and $V_{bias}$ at the minimum point during the search as $V_{min}$ and $V_{set}$ on the memory 26. FIG. 9 shows $V_{PD}$ acquired while $V_{bias}$ is swept from $V_2$ to $V_1$. In this embodiment, the semiconductor laser 10 generates the light with the center frequency $f_0$ and the first-order sideband light pair with the frequency $f_0 \pm f_m$ as shown in FIG. 2, and the first-order sideband light pair is the resonance light pair. Therefore, if $V_{bias}$ is swept from $V_2$ to $V_1$, five absorption bands, namely an absorption band $B_5$ in which only the light of $f_0-f_m$ is absorbed, an absorption band $B_4$ in which only the light of $f_0$ is absorbed, an absorption band $B_3$ in which the light of $f_0+f_m$ and the light of $f_0-f_m$ are absorbed, an absorption band $B_2$ in which only the light of $f_0$ is absorbed, and an absorption band $B_1$ in which only the light of $f_0+f_m$ is absorbed are observed in this order. $V_{PD}$ at the minimum point of the third absorption band $B_3$ is the smallest, $V_{set}$ is a value which is slightly lower than the minimum point, and $V_{min}$ is a value which is slightly higher than the minimum value.

After the processing in Steps S72 to S84 is completed, the MPU 25 performs the processing in Step S52 to S64, and performs the processing in Steps S86 and S88 or performs the processing in Step S66 and the following processing again in accordance with the determination result in Steps S62 and S64. In the processing in Steps S52 to S64 described herein, $V_{PD}$ and $V_{set}$ stored in Step S82 are used instead of $V_{PD}$ and $V_{set}$ stored on the memory 26 when the power is supplied. In addition, the threshold values (the values of X and Y) for the determination in Steps S62 and S64 performed after the first time may be the same as or different from threshold values for the determination in Steps S62 and S64 performed for the first time.

By the MPU 25 performing the adjustment determination processing (processing in Steps S50 to S64) first after the power is supplied and then performing the re-sweep determination processing (the processing in Steps S52 to S64) every time the sweep processing (the processing in Steps S72 to S84) is performed if it is necessary to change the setting of the bias current, the bias current is automatically set such that the center frequency $f_0$ coincides with the minimum point of the absorption band.

In addition, if the current control circuit 22 is configured to be able to output a voltage corresponding to a setting value of $V_{bias}$ immediately after receiving the setting value from the MPU 25, the processing in Steps S50 to S56 may be replaced with processing of supplying the setting value $V_{set}$ from the MPU 25 to the current control circuit 22. Similarly, the processing in Steps S66 to S70 may be replaced with processing of supplying the setting value $V_2$ from the MPU 25 to the current control circuit 22.

Figure 10A:
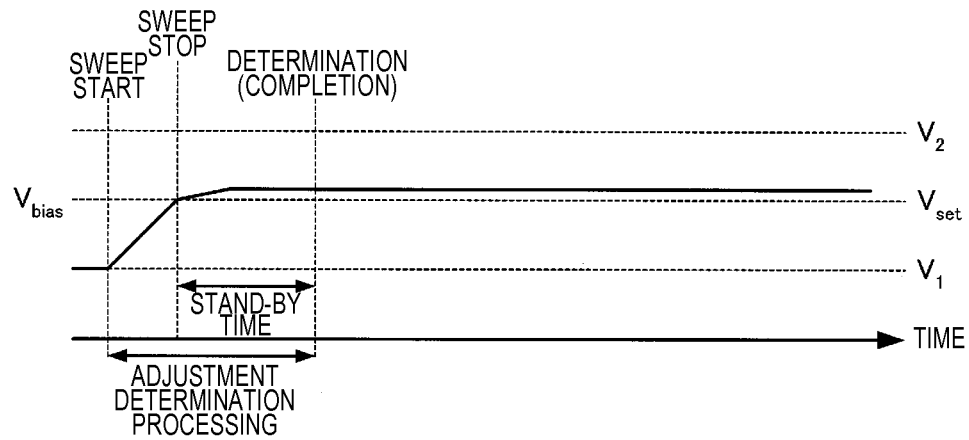
FIGS. 10A and 10B are diagrams showing an example of an output voltage of the current control circuit in the bias current automatic setting processing.
Figure 10B:
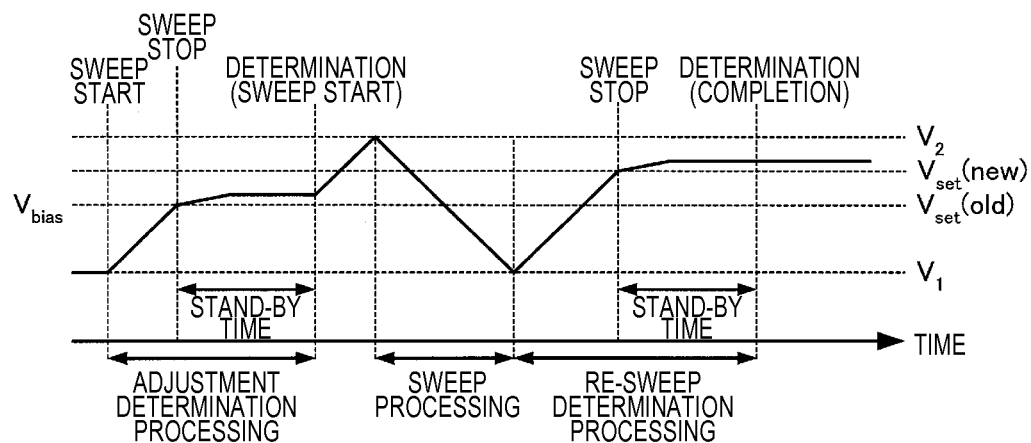

FIGS. 10A and 10B show examples of behaviors of $V_{bias}$ in the bias current automatic setting processing. FIG. 10A shows an example in which the processing is completed after the adjustment determination processing is performed (without performing the sweep processing), and FIG. 10B shows an example in which the sweep processing is completed after being performed once after the adjustment determination processing.

According to the atomic oscillator of the second embodiment, it is determined that the sweep processing is not to be performed when the difference (ratio) between acquired $V_{PD}$ and the value $V_{min}$ stored on the memory 26 is within the predetermined range and the difference (ratio) between acquired $V_{bias}$ and the value $V_{set}$ stored on the memory 26 is within the predetermined range in the state where $V_{bias}$ is set to the value $V_{set}$ stored on the memory 26 and is stabilized (locked), or it is determined that the sweep processing is to be performed in the other cases in the adjustment determination processing as described above. With such a configuration, it is possible to omit unnecessary sweep processing and to reduce a bias current setting time and power consumption.

In addition, according to the atomic oscillator of the second embodiment, $V_{bias}$ and $V_{PD}$ in the vicinity of the minimum point of the light absorption band of the gas cell 13 are stored as $V_{set}$ and $V_{min}$, respectively on the memory 26 in the sweep processing when it is determined in the adjustment determination processing that the sweep processing is to be performed, and it is determined that the sweep processing is not to be performed again when the difference (ratio) between acquired $V_{PD}$ and $V_{min}$ is within the predetermine range and the difference (ratio) between acquired $V_{bias}$ and $V_{set}$ is within the predetermined range in the state where the $V_{bias}$ is set to $V_{set}$ and is stabilized (locked) in the re-sweep determination processing, or it is determined that the sweep processing is to be performed again in the other cases in the adjustment determination processing. With such a configuration, the sweep processing is repeated as long as necessary, and the bias current is automatically set so as to be stabilized in the vicinity of the minimum point of the absorption band. Therefore, according to the atomic oscillator of the second embodiment, it is possible to acquire an EIT signal with high S/N and to enhance the frequency stability.

2. Electronic Apparatus

Figure 11:
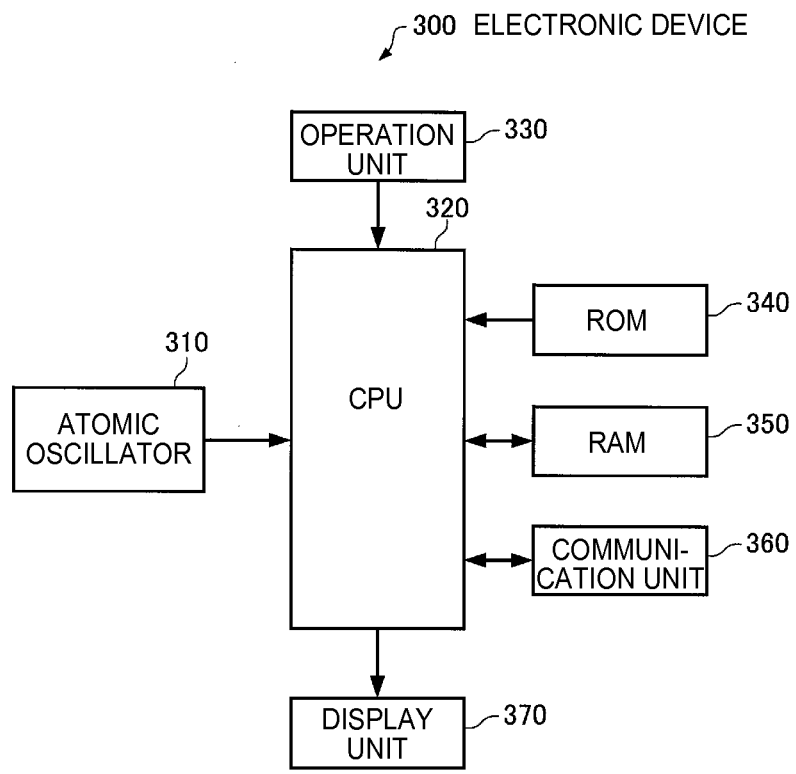
FIG. 11 is a functional block diagram of an electronic apparatus according to an embodiment.

FIG. 11 is a functional block diagram of an electronic apparatus according to this embodiment.

An electronic apparatus 300 according to the embodiment includes an atomic oscillator 310, a central processing unit (CPU) 320, an operation unit 330, a read only memory (ROM) 340, a random access memory (RAM) 350, a communication unit 360, and a display unit 370. In addition, the electronic apparatus according to the embodiment may have a configuration in which a part of the constituents (respective units) in FIG. 11 is appropriately omitted or changed or a configuration in which other constituents are added thereto.

The atomic oscillator 310 is the atomic oscillator 1 according to the aforementioned embodiments, which outputs a clock signal with high long-term stability.

The CPU 320 follows programs stored on the ROM 340 or the like and performs various kinds of calculation processing and control processing. Specifically, the CPU 320 performs various kinds of computation processing, various kinds of processing in response to operation signals from the operation unit 330, processing controlling the communication unit 360 for data communication with outside, processing of transmitting display signals to cause the display unit 370 to display various kinds of information, and the like in synchronization with a clock signal output from the atomic oscillator 310.

The operation unit 330 is an input device configured of an operation key, a button switch, and the like and outputs operation signals in accordance with user operations to the CPU 320.

The ROM 340 stores programs, data, and the like for the CPU 320 performing various kinds of calculation processing and control processing.

The RAM 350 is used as a work area of the CPU 320 and temporarily stores the programs and the data read from the ROM 340, data input from the operation unit 330, results of computation executed by the CPU 320 in accordance with the various programs, and the like.

The communication unit 360 performs various kinds of control for establishing data communication between the CPU 320 and external devices.

The display unit 370 is a display device configured of a liquid crystal display (LCD) or the like and displays various kinds of information based on a display signal input from the CPU 320. The display unit 370 may be provided with a touch panel which functions as the operation unit 330.

By incorporating the atomic oscillator 1 according to the embodiments as the atomic oscillator 310, it is possible to realize an electronic apparatus capable of maintaining high reliability for a long period of time.

Examples of such an electronic apparatus 300 include a time management server (time server) which realizes synchronization with the standard time, a time management device (time stamp server) which issues a time stamp, for example, and a frequency reference device such as a base station. Other various electronic apparatuses can be considered as the electronic apparatus 300, and examples thereof include personal computers (a mobile personal computer, a laptop personal computer, and a tablet personal computer, for example), mobile terminals such as a smart phone and a mobile phone, a digital still camera, an ink-jet ejecting apparatus (an ink-jet printer, for example), storage area network devices such as a router and a switch, a local area network device, a device for a mobile terminal base station, a television, a video camera, a video recorder, a car navigation apparatus, a real-time clock device, a pager, an electronic organizer (including an electronic organizer with a communication function), an electronic dictionary, a calculator, an electronic game device, a game controller, a word processor, a work station, a video telephone, a security television monitor, an electronic binocular, a POS terminal, medical equipment (an electronic thermometer, a hemopiezometer, a blood glucose meter, an electrocardiograph measurement apparatus, an ultrasonic diagnosis apparatus, and an electronic endoscope), a fish sonar, various measurement devices, meter gauges (meter gauges for a vehicle, an aircraft, a marine vessel, for example), a flight simulator, a head-mount display, motion trace, motion tracking, a motion controller, and a pedestrian dead-reckoning (PDR).

3. Moving Object

Figure 12:
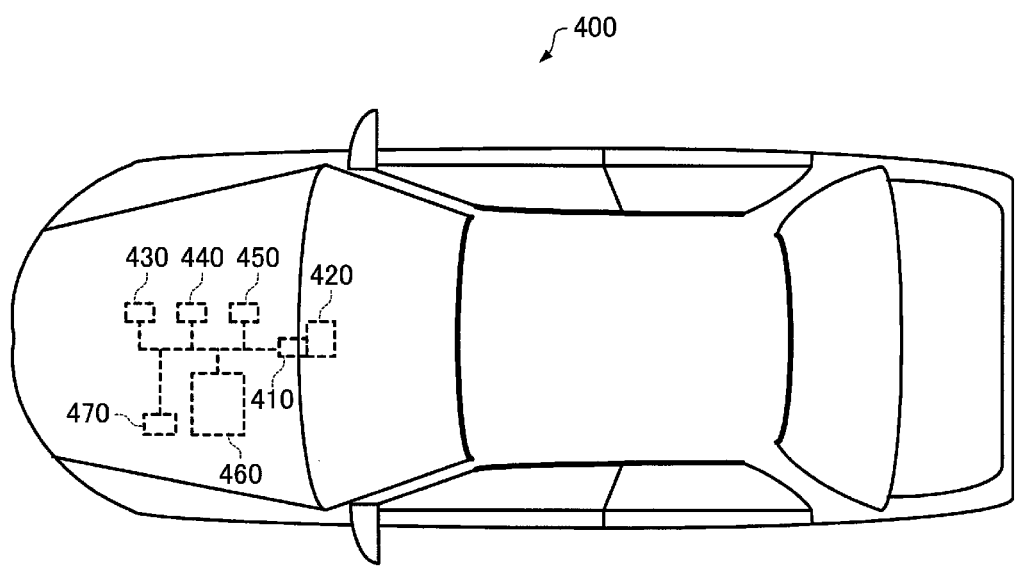
FIG. 12 is a diagram showing an example of a moving object according to the embodiment.
Figure 13:
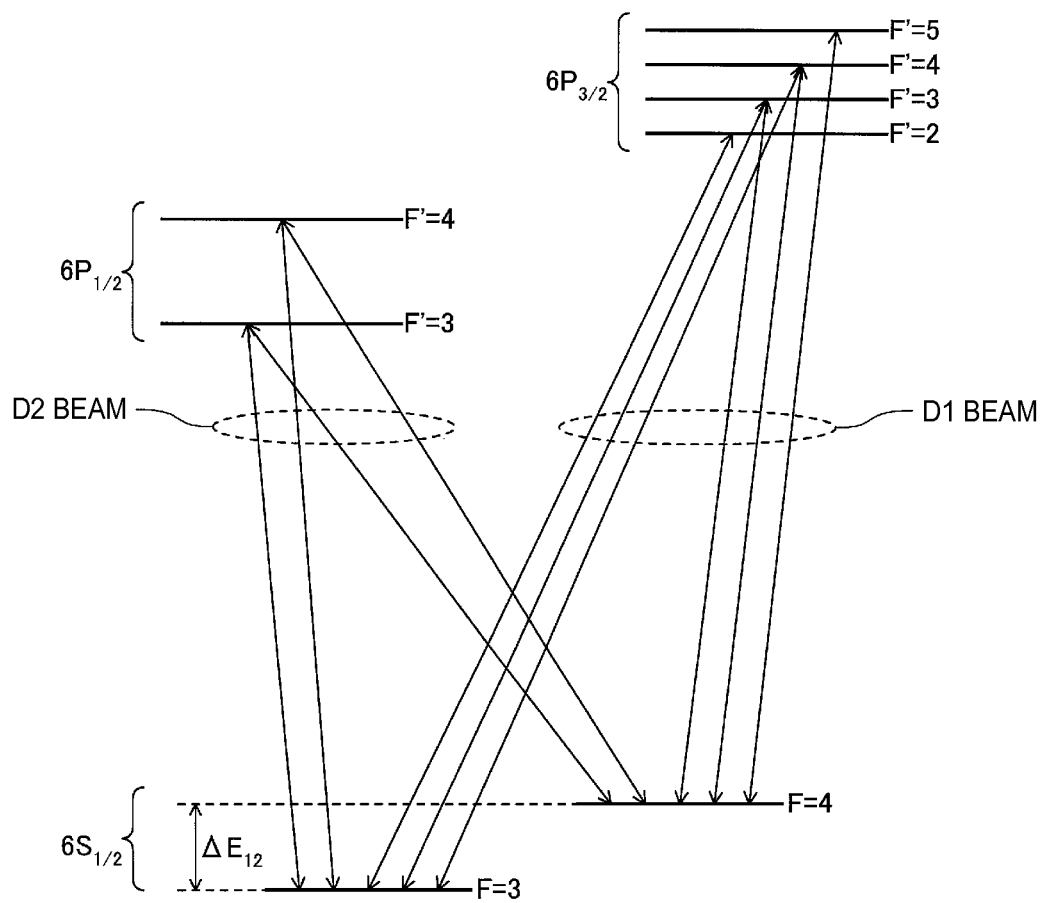
FIG. 13 is a diagram schematically showing energy levels of a cesium atom.
Figure 14:
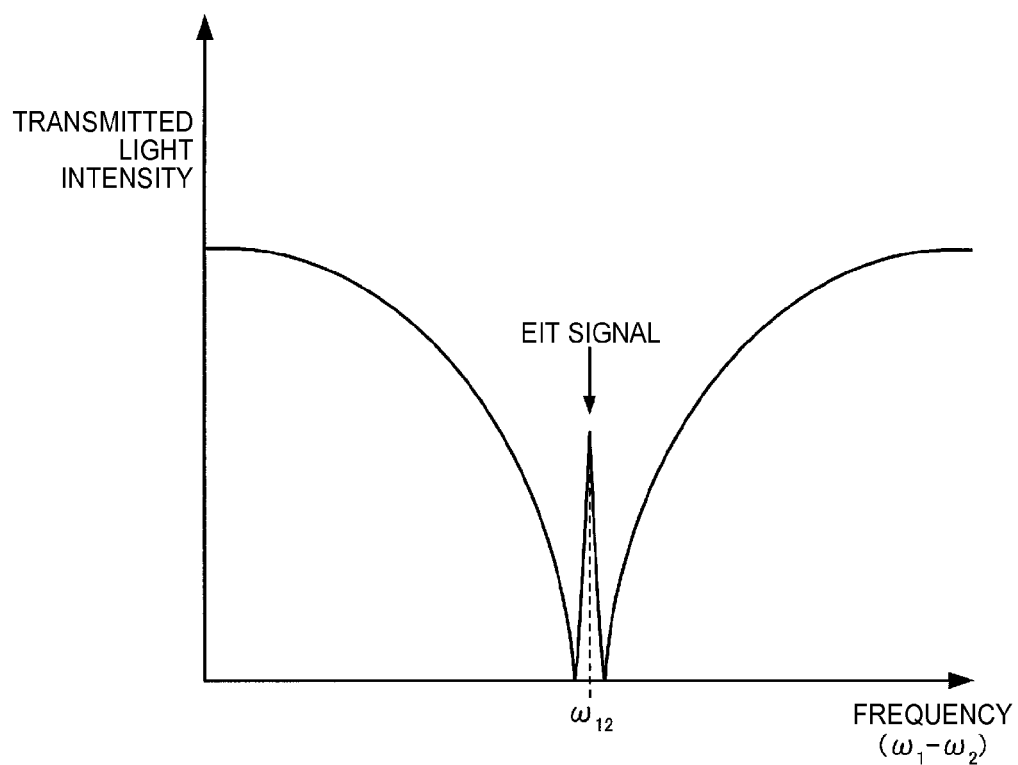
FIG. 14 is an outline diagram showing an example of an EIT signal.

FIG. 12 is a diagram (upper view) showing an example of a moving object according to the embodiment. A moving object 400 shown in FIG. 12 includes an atomic oscillator 410, a car navigation device 420, controllers 430, 440, and 450, a battery 460, and a back-up battery 470. In addition, the moving according to the embodiment may have a configuration in which a part of the constituents (respective units) in FIG. 11 is appropriately omitted or changed or a configuration in which other constituents are added thereto.

The atomic oscillator 410 is for outputting a clock signal with long-term stability, and the atomic oscillator 1 according to the aforementioned embodiments can be applied to the atomic oscillator 410.

The car navigation device 420 displays various kinds of information such as a position and a time in synchronization with the clock signal output from the atomic oscillator 410.

The controllers 430, 440, and 450 perform various kinds of control on an engine system, a brake system, a key-less entry system, and the like. The controllers 430, 440, and 450 may perform the various kinds of control in synchronization with the clock signal output from the atomic oscillator 410.

The moving object 400 according to this embodiment can maintain high reliability for a long period of time by being provided with the atomic oscillator 410.

Various moving objects can be considered as such a moving object 400, and examples thereof include a vehicle (including an electric vehicle), aircrafts such as a jet aircraft and a helicopter, a marine vessel, a rocket, and an artificial satellite.

4. Application Examples

According to the atomic oscillator of the aforementioned embodiments, Zeeman Splitting occurs in the energy levels of the alkali metal atoms if a magnetic field is applied to the gas cell 13, and the frequency difference $\omega_{12}$ of the resonance light pair which causes the EIT phenomenon varies depending on intensity of the magnetic field (the oscillation frequency varies as a result). By utilizing this property, it is possible to apply the atomic oscillator according to the embodiments to a magnetic sensor.

In addition, since the atomic oscillator according to the embodiments can create a significantly stable quantum interference state (quantum coherence state) of the alkali metal atoms, it is possible to realize a light source used for quantum information devices such as a quantum computer, a quantum memory, and a quantum cryptographic system by extracting the resonance light pair which is incident on the gas cell 13.

The invention is not limited to the embodiments, and various modifications can be made within the scope of the gist of the invention.

The aforementioned embodiments and modification examples are illustrative examples, and the invention is not limited thereto. For example, it is possible to appropriately combine the respective embodiments and the respective modification examples.

The invention includes configurations which are substantially the same with the configurations described in the embodiments (a configuration with the same functions, the same methods, and the same results or a configuration with the same purposes and advantages, for example). In addition, the invention includes configurations in which a part that is not essential part of the configurations described in the embodiments is replaced. Moreover, the invention includes configurations which exhibit the same effects as those of the configurations described in the embodiment or configurations with which the same purpose can be achieved. In addition, the invention includes configuration achieved by adding a known technology to the configurations described in the embodiments.

The entire disclosure of Japanese Patent Application No. 2013-202239, filed Sep. 27, 2013 is expressly incorporated by reference herein.

What is claimed is:

1. An atomic oscillator comprising:
a cell which encapsulates metal atoms therein;
a light source which generates light for irradiation of the cell;
a light detecting section which detects light penetrating through the cell;
a bias current control section which controls a bias current to be supplied to the light source based on intensity of light detected by the light detecting section;
a storage section; and
a bias current setting section which performs sweep processing of sweeping the bias current and storing on the storage section a value of the bias current and a value of the intensity of the light when the intensity of the light detected by the light detecting section shifts from a decrease to an increase and re-sweep determination processing of setting the bias current based on the value of the bias current stored on the storage section after the sweep processing, comparing the value of the intensity of the light detected by the light detecting section with the value of the intensity of the light stored on the storage section in a state where the bias current control section controls the bias current, and determining whether or not to perform the sweep processing again in accordance with a comparison result.

2. The atomic oscillator according to claim 1,
wherein the bias current setting section determines to perform the sweep processing again when a difference or a ratio between the value of the intensity of the light detected by the light detecting section and the value of the intensity of the light stored on the storage section is greater than a threshold value stored on the storage section in the re-sweep determination processing.

3. The atomic oscillator according to claim 1,
wherein the bias current setting section compares the value of the bias current and a value of the bias current stored on the storage section in a state where the bias current control section controls the bias current and determines whether or not to perform the sweep processing again in accordance with a comparison result in the re-sweep determination processing.

4. The atomic oscillator according to claim 3,
wherein the bias current setting section determines to perform the sweep processing again when a difference or a ratio between the value of the bias current and the value of the bias current stored on the storage section is greater than a threshold value stored on the storage section in the re-sweep determination processing.

5. The atomic oscillator according to claim 1,
wherein the bias current setting section performs the re-sweep determination processing every time the sweep processing is performed.

6. The atomic oscillator according to claim 1,
wherein the bias current setting section performs adjustment determination processing of setting the bias current based on the value of the bias current stored on the storage section, comparing the value of the intensity of the light detected by the light detecting section with the value of the intensity of the light stored on the storage section in a state where the bias current control section controls the bias current, and determining whether or not to perform the sweep processing in accordance with a comparison result, prior to the sweep processing.

7. The atomic oscillator according to claim 6,
wherein the bias current setting section determines to perform the sweep processing when a difference or a ratio between the value of the intensity of the light detected by the light detecting section and the value of the intensity of the light stored on the storage section is greater than the threshold value stored on the storage section in the adjustment determination processing.

8. The atomic oscillator according to claim 6,
wherein the bias current setting section compares the value of the bias current with the value of the bias current stored on the storage section in the state where the bias current control section controls the bias current and determines whether or not to perform the sweep processing in accordance with a comparison result in the adjustment determination processing.

9. The atomic oscillator according to claim 8,
wherein the bias current setting section determines to perform the sweep processing when a difference or a ratio between the value of the bias current and the value of the bias current stored on the storage section is greater than the threshold value stored on the storage section in the adjustment determination processing.

10. An electronic apparatus comprising:
the atomic oscillator according to claim 1.

11. A moving object comprising:
the atomic oscillator according to claim 1.

* * * * *